United States Patent [19]
Tsukude et al.

[11] Patent Number: 5,646,900
[45] Date of Patent: Jul. 8, 1997

[54] SENSE AMPLIFIER INCLUDING MOS TRANSISTORS HAVING THRESHOLD VOLTAGES CONTROLLED DYNAMICALLY IN A SEMICONDUCTOR MEMORY DEVICE

[75] Inventors: Masaki Tsukude; Kazutami Arimoto, both of Hyogo, Japan

[73] Assignee: Mitsubishi Denki Kabushiki Kaisha, Tokyo, Japan

[21] Appl. No.: 583,893

[22] Filed: Jan. 11, 1996

[30] Foreign Application Priority Data

Jan. 12, 1995 [JP] Japan ................................. 7-003248

[51] Int. Cl.$^6$ .................................................. G11C 11/419
[52] U.S. Cl. ........................... 365/205; 365/207; 365/208; 365/189.09; 365/190; 365/227; 365/203; 365/193; 365/194
[58] Field of Search ........................ 365/205, 207, 365/208, 189.09, 190, 227, 203, 193, 194

[56] References Cited

U.S. PATENT DOCUMENTS 5,177,586  1/1993  Ishimura et al. ...................... 257/368
5,337,270  8/1994  Kawata et al. ....................... 365/149

FOREIGN PATENT DOCUMENTS 2-231760  9/1990  Japan.

*Primary Examiner*—David C. Nelms
*Assistant Examiner*—Andrew Q. Tran
*Attorney, Agent, or Firm*—Lowe, Price, LeBlanc & Becker

[57] ABSTRACT

N channel sense amplifier transistors have their backgate potentials set to a backgate precharge potential higher than a potential intermediate between an operation power supply potential and a ground potential prior to start of sensing operation, and then lowered following the lowering of an n common source node potential during the sensing operation. The n common source node is precharged to the intermediate potential. The backgate precharge potential is set no greater than a potential of the intermediate potential plus a pn junction diffusion, to suppress a leakage current from the backgate to source or drain of each of the sense amplifier transistors. P channel sense amplifier transistors have also their backgate potential set to a precharge potential lower than the intermediate potential prior to sensing operation and raised following the rise of a p common source node potential.

31 Claims, 21 Drawing Sheets

:Vth LARGE

:Vth SMALL

:Vth LARGE

SENSE AMPLIFIER INCLUDING MOS TRANSISTORS HAVING THRESHOLD VOLTAGES CONTROLLED DYNAMICALLY IN A SEMICONDUCTOR MEMORY DEVICE

BACKGROUND OF THE INVENTION

1. Field of the Invention

The present invention relates to a sense amplifier for sensing and amplifying a memory cell data potential, and more particularly relates to a differential sense amplifier formed of insulated gate type field effect transistors in a dynamic random access memory.

2. Description of the Related Art

A personal computer and a work station generally contain a memory for data storage. There is a DRAM (Dynamic Random Access Memory) having a large storage capacity and having data readable and writable as such a memory, which is used as a main memory in a personal computer, a work station and such.

FIG. 1 shows a configuration of a sense amplifier and peripheral circuitry thereof in a conventional DRAM, as disclosed in Japanese Patent Laying-Open No. 2-231760, for example.

Referring to FIG. 1, a sense amplifier 5 receives as power source potentials an operational power supply potential Vcc at a power supply node 1a and a ground potential Vss at a ground node 1b, and senses and amplifies the difference of potentials on bit lines 2a and 2b in response to sense amplifier enable signals SEN and SEP.

Sense amplifier 5 includes a p channel MOS (insulated gate type field effect) transistor 5a connected between power supply node 1a and a node 5b and receiving the sense amplifier enable signal SEP at a gate thereof, and a PMOS sense amplifier 5c for bringing a potential of a bit line having a higher potential out of bit lines 2a and 2b to power supply potential Vcc, an n channel MOS transistor 5f connected between ground node 1b and a node 5e and receiving the sense amplifier enable signal SEN, and an n MOS sense amplifier 5d for bringing a potential of a bit line at a lower potential out of bit lines 2a and 2b to ground potential Vss.

PMOS sense amplifier 5c includes a p channel MOS transistor 5ca connected between node 5b and bit line 2a and having a gate connected to bit line 2b, and a p channel MOS transistor 5cb connected between node 5b and bit line 2b and having a gate connected to bit line 2a.

NMOS sense amplifier 5d includes an n channel MOS transistor 5da connected between a node 5e and bit line 2a and having a gate connected to bit line 2b, and an n channel MOS transistor 5db connected between node 5e and bit line 2b and having a gate connected to bit line 2a. NMOS transistors 5da and 5db are formed in a well region which is isolated from any other circuit regions and is supplied with a well potential VSB from a well potential control circuit 6.

Well potential control circuit 6 includes a current mirror type differential amplifier 6a responsive to a control signal /φSTR for amplifying the difference between a reference voltage Vref and a potential Va at node 5e for outputting a signal indicating the result of amplification, and a control circuit 6b responsive to a control signal φSTR and the signal from the amplifier 6a for producing the well potential VSB.

Differential amplifier includes a p channel MOS transistor 6aa connected between power supply node 1a and a node 6ab and receiving the control signal /φSTR at a gate thereof, a p channel MOS transistor 6ac connected between node 6ab and a node 6ad and having a gate connected to node 6ad, a p channel MOS transistor 6af connected between node 6ab and a node 6ag and having a gate connected to node 6ag, an n channel MOS transistor 6ae connected between node 6ad and ground node 1b and receiving the reference potential Vref, and an n channel MOS transistor 6ah connected between node 6ag and ground node 1b and having a gate receiving the potential at node 5e.

Transistors 6ac and 6af constitute a current mirror circuit to supply a current to respective transistors 6ae and 6ab, which in turn constitute a comparison stage.

Control circuit 6b includes an n channel MOS transistor 6ba connected between a node receiving an intermediate potential Vcc/2 and a node 6bc and having a gate receiving the control signal φSTR, a p channel MOS transistor 6bd connected between node 6bc and ground node 1b and having a gate receiving the output signal at node 6ag of the amplifier 6a, and a capacitor 6be connected between node 6bc and ground node 1b. Well potential VSB is generated at node 6bc.

Control signal φSTR is made high until sense amplifier enable signal SEN is made active (high) when a memory cycle is started. Control signal /φSTR is made low until sense amplifier enable signal SEP is made active (low) when a memory cycle is started.

Word lines 3a and 3b are arranged crossing the bit lines 2a and 2b, respectively. Each of word lines 3a and 3b connects memory cells on a row, and each of bit lines 2a and 2b connects memory cells on a column (in an "open bit line arrangement").

Although memory cells are arranged in a matrix of rows and columns, two memory cells 4a and 4b are representatively shown in FIG. 1. Memory cell 4a is located at a crossing of word line 3b and bit line 2a, and includes a capacitor 4aa for storing information in a form of electric charges, and an n channel MOS transistor 4ab responsive to a potential on word line WL0 for coupling the capacitor 4ab to bit line 2a. Capacitor 4aa receives a precharge potential Vp at intermediate potential Vcc/2 at one electrode (cell plate), and MOS transistor 4ab receives a predetermined, constant negative backgate bias potential VBB at a bulk (backgate).

Memory cell 4b similarly includes a capacitor 4ba and an n channel MOS transistor 4bb. Precharge potential Vp is also applied to cell plate of capacitor 4aa, and backgate bias potential VBB is applied to backgate of MOS transistor 4bb. The backgate bias potential VBB is also applied to a backgate of MOS transistor 5f in sense amplifier 6.

Now, operation of the circuitry shown in FIG. 1 will be described with reference to a waveform diagram of FIG. 2 representing an operation when an "L" level data stored in memory cell 4a is read out.

Before time t0 when a row address strobe signal RAS defining a memory cycle rises to an H (high) level, as shown at (a) in FIG. 2, sense amplifier enable signals SEP and SEN as shown respectively at (b) and (c) in FIG. 2 are H level and L level, respectively. P channel MOS transistor 5a and n channel MOS transistor 5f receiving the respective enable signals SEP and SEN at their gates are both non-conductive, and therefore power supply potential Vcc and ground potential Vss are not supplied to PMOS sense amplifier 5c and NMOS sense amplifier 5d, so that sense amplifier 5 is kept inactive.

Potentials WL0 and WL1 on word lines 3a and 3b shown at (e) and (f) in FIG. 2 are both at L level, and MOS transistors 4ab and 4bb in memory cells 4a and 4b are both kept non-conductive, and data are held in memory cells 4a and 4b.

Potentials BL and /BL on bit lines 2a and 2b as shown at (g) in FIG. 2 are precharged at a precharge potential of Vcc/2 by not shown bit line precharge circuit. Potential Va at node 5e as shown at (i) in FIG. 2 is set at the bit line precharge potential by not shown precharge circuit, and MOS transistors 5da and 4db are both turned off.

Control signals /φSTR and φSTR are at H level and L level, respectively in accordance with row address strobe signal RAS and sense amplifier enable signals SEP and SEN, as shown at (d) in FIG. 2. P channel MOS transistor 6aa receiving the control signal /φSTR at the gate thereof is in a non-conductive state, and the differential amplifier 6a is held in the inactive state because power supply potential Vcc is not supplied to the amplifier. N channel MOS transistor 6ba receiving the control signal φSTR at the gate thereof is also in the non-conductive state, so that the control circuit 6b is kept inactive and well potential VSB generated at node 6bc is kept at ground potential Vss attained in the previous active cycle as shown at (b) in FIG. 2.

When row address strobe signal RAS rises to H level at time t0 as shown at (a) in FIG. 2, a standby cycle is completed and a memory cycle (active cycle) is started. Responsively, control signals /φSTR and φSTR go low and high, respectively, as shown at (d) in FIG. 2, to activate differential amplifier 6a and control circuit 6b in well potential control circuit 6.

Potential Va at node 5e in sense amplifier 5 is higher than reference potential Vref at this time, and the conductance of MOS transistor 6ah is greater than that of MOS transistor 6ae, so that node 6ag is discharged through MOS transistor 6ah to a potential at ground node 1b and the signal potential at node 6ag is made low to turn off MOS transistor 6bd in control circuit 6b. MOS transistor 6ba is turned on in response to the rise of control signal φSTR to charge the node 6bc at intermediate potential Vcc/2. Thus, well potential VSB generated from node 6bc rises at a predetermined time constant to Vcc/2, as shown at (b) in FIG. 2.

A row address signal incorporated at a rising edge of row address strobe signal RAS is decoded by not shown row decoder. Potential WL0 of word line 3a designated by the row address signal rises to H level at time t1, as shown at (e) in FIG. 2. Responsively, MOS transistor 4ab in memory cell 4a is made conductive to couple bit line 2a precharged at Vcc/2 with the electrode (storage node) at ground potential of capacitor 4aa. Electric charges on bit line 2a flow into the storage node of capacitor 4aa, and potential BL of bit line 2a is lowered a little from precharge potential Vcc/2, as shown at (g) in FIG. 2. Because potential WL1 of word line 3b is kept at L level, no data is read from memory cell 4b onto bit line 2b, and potential /BL of bit line 2b is maintained at precharge potential Vcc/2, as shown at (g) in FIG. 2.

When sense amplifier enable signal SEN is raised to H level at time t2 as shown at (c) in FIG. 2, MOS transistor 5f in sense amplifier 5 is made conductive to activate NMOS sense amplifier 5d, and potential BL of bit line 2a is fallen to ground potential Vss, as shown at (g) in FIG. 2. Potential Va at node 5e is also lowered down to ground potential Vss, and becomes lower than reference potential Vref. Thus, the signal generated from the differential amplifier 6a goes high to turn on MOS transistor 6bd. Since MOS transistor 6ba is turned off in response to control signal φSTR when sense amplifier enable signal SEN is made active, well potential VSB is brought to ground potential Vss through MOS transistor 6bd. Although control signal φSTR is made low when sense amplifier enable signal SEN is made high at time t2 as shown at (d) in FIG. 2, control signal /φSTR is still kept active at L level. The potential at node 6ag is proportional to the difference of potentials Vref and Va, and MOS transistor 6bd discharges node 6bc such that well potential VSb is lowered tracing the lowering of potential Va.

When sense amplifier enable signal SEP is made active at time t3 as shown at (b) in FIG. 2, control signal /φSTR is rendered inactive (high) as shown at (d) in FIG. 2 to deactivate the differential amplifier 6a. MOS transistor 5a turns on in response to the fall (activation) of sense amplifier enable signal SEP to activate PMOS sense amplifier 5c. Potential /BL on bit line 5c is pulled up to power supply potential Vcc as shown at (g) in FIG. 2. Sensing and amplifying operation of sense amplifier 5 completes when the small potential difference between bit lines 2a and 2b is amplified up to the potential difference between power supply potential Vcc and ground potential Vss.

Now, operational effect of controlling the well potential VSB will be described with reference to FIGS. 3A to 3C depicting the potentials of respective nodes of MOS transistors 5da and 5db in NMOS sense amplifier 5d shown in FIG. 1.

It is well known in the art that MOS transistor has a backgate effect wherein a threshold voltage changes depending on a backgate bias potential with respect to a source potential. A threshold voltage Vthn and a backgate bias potential VBB with respect to a source potential satisfy the following relationship:

$$Vthn = A + \sqrt{B + |VBB|} \quad ,$$

where A and B each are a constant determined by transistor parameters. If |VBB| increases, Vthn also increases. Referring to FIG. 3A, in a standby state, MOS transistors 5da and 5db receive well potential VSB at 0 V (=Vss) at their gates and potential Va at Vcc/2 at their sources, where it is assumed that intermediate potential Vcc/2 is greater than the threshold voltage Vthn of MOS transistors 5da and 5db. In this condition, |VBB|=|Vcc/2|, and MOS transistors 5da and 5db each have relatively large threshold voltage. Bit lines 2a and 2b are precharged to intermediate potential Vcc/2.

Referring to FIG. 3B, when a word line (30) is selected and driven to a selected state (high level potential), memory cell data is read out onto bit line 2a, the potential of bit line 2a changes from intermediate potential Vcc/2 to Vcc/2−ΔV where ΔV denotes a read out voltage, and the potential of bit line 2b maintains the precharge potential at intermediate potential Vcc/2. Potential Va at node 5e also maintains the precharge potential at intermediate potential Vcc/2. Well potential VSB changes from ground potential Vss (=0 V) to intermediate potential Vcc/2.

Before the start of sensing, well potential VSB is at intermediate potential Vcc/2. Thus, MOS transistors 5da and 5db each have the source and backgate potentials equal with each other, or |VBB|=0, and the threshold voltage of MOS transistors 5da and 5db becomes relatively small.

Referring to FIG. 3C, when sensing operation is started, potential Va at node 5a is lowered to ground potential Vss (=0 V). When the potential difference between bit line 2b and node 5e, or Vcc/2−Va becomes greater than the threshold voltage Vth of MOS transistor 5da, MOS transistor 5da turns on to discharge the bit line 2a. The threshold voltage Vth is smaller than that in the case of VSB=0 V, and bit line discharging can be caused soon after sense amplifier enable signal SEN is made active. That is, sensing operation is done at a higher speed as compared to the case where a constant well potential is applied.

During the lowering of potential Va at node 5e, well potential VSB is lowered following the lowering of potential Va, and the difference between potentials VSB and Va is kept substantially constant, and the threshold voltage Vth is accordingly kept constant at a small value.

Since the threshold voltage Vth is forcedly made small upon sensing operation, even if power supply voltage Vcc is reduced and the difference between the power supply voltage Vcc and the threshold voltage Vth with VSB at 0 V is very small, the threshold voltage Vth can be effectively made small and MOS transistors 5da or 5db can be reliably made conductive. Thus, a sense amplifier operates at a high speed even under a low power supply voltage condition.

However, while the minimum threshold voltage can be provided when the backgate potential (well potential) and the source potential (node 5e potential) are made equal, such countermeasure only eliminates the backgate effect. In general, MOS transistor has a threshold voltage of about 0.7–1.0 V with no backgate bias effect. On the other hand, according to the recent trend, power supply voltage is made lower and lower, or 3.3 V, 1.5 V or 1.2 V for the purpose of fast operation and of the reduction of power dissipation. If power supply voltage of 1.2 V is employed, intermediate potential Vcc/2 is 0.6 V, and MOS transistor of threshold voltage 0.7 V with no backgate effect cannot be used. That is, the conventional sense amplifier arrangement cannot be applied to a device operating with a low power supply potential.

In addition, as shown in FIG. 3C, MOS transistor 5db receives ground potential at its gate to be turned off after the sensing operation is completed. However, in this state, memory cell data is latched and the potential on bit line 2b is power supply potential. The threshold voltage Vth of MOS transistor 5db is kept small, and therefore a large subthreshold current flows from bit line 2b to ground node 1b (FIG. 1) through MOS transistor 5db and sense amplifier activating MOS transistor 5f (FIG. 1), and current consumption is increased. Here, a subthreshold current is a current flowing through MOS transistor when potentials at a gate and a source of the MOS transistor are equal to each other, and it is known in the art that the subthreshold current increases as the absolute value of the threshold voltage decreases.

SUMMARY OF THE INVENTION

An object of the present invention is to provide a semiconductor memory device operating with a low power supply potential at a high speed.

Another object of the present invention is to provide a semiconductor memory device in which a fast sensing operation is implemented.

A semiconductor memory device according to the present invention includes cross coupled MOS transistors coupled between a first node and a pair of bit lines and for differentially amplifying the potentials on the bit lines. The cross coupled MOS transistors each have a backgate coupled to receive a backgate potential. The first node receives an intermediate potential in a standby state and a first potential upon differential amplification of bit line potentials, or sensing operation. The backgate potential is set to a certain potential. The difference in absolute value between the certain potential and the intermediate potential is greater than that between the intermediate potential and the first potential.

The difference in absolute value between the first potential and the certain potential is no more than pn junction diffusion potential at a junction of the backgate and source/drain of the cross coupled MOS transistors.

The backgate potential is adapted to change following the change of the first node potential during sensing operation.

Since the backgate bias is made shallower than in the case where the backgate potential and the source potential are made equal to each other, the threshold voltage of each of cross coupled MOS transistors is made smaller in absolute value due to the backgate effect. Thus, immediately after the change of the first node potential, one of the cross coupled MOS transistors turns on depending on the bit line potentials, and the sensing operation can be started at an earlier timing. In addition, the backgate potential changes following the change of the first node potential, and the forward biasing of the backgate to the source/drain of the cross coupled MOS transistors can be reliably prevented.

The threshold voltage of the cross coupled MOS transistors can be effectively small in absolute value, and thus even if the power supply potential is reduced and the intermediate potential approaches the absolute value of the threshold voltage of the cross coupled MOS transistors in a case, where the backgate potential and source potential is made equal, the absolute value of the threshold voltage of the cross coupled MOS transistors can be smaller upon sensing operation, and one of the cross coupled MOS transistors can be reliably turned on, and therefore reliable sensing operation can be implemented even under a very low power supply potential.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
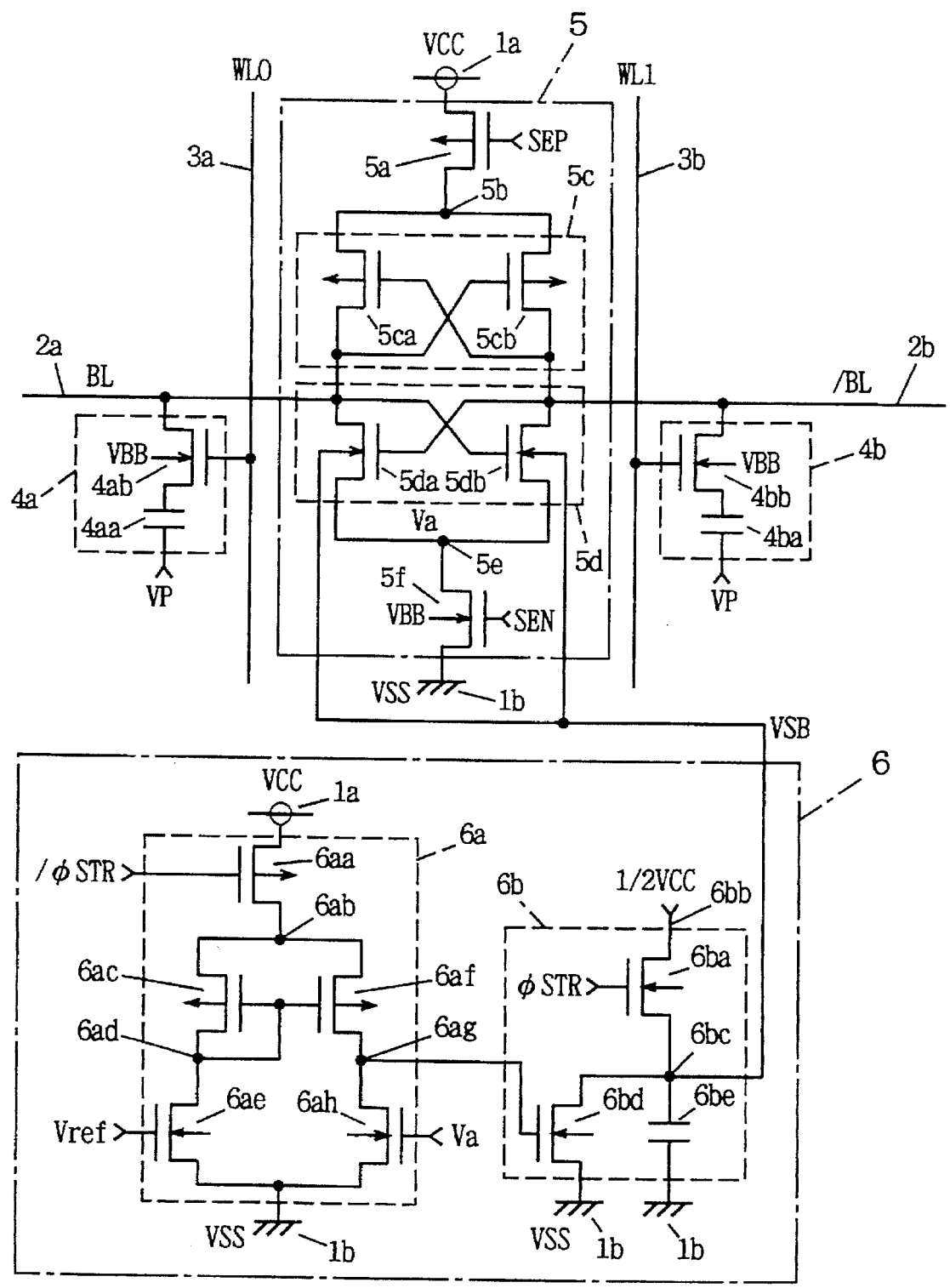
FIG. 1 shows a configuration of a conventional sense amplifier and peripheral circuitry thereof.
Figure 2:
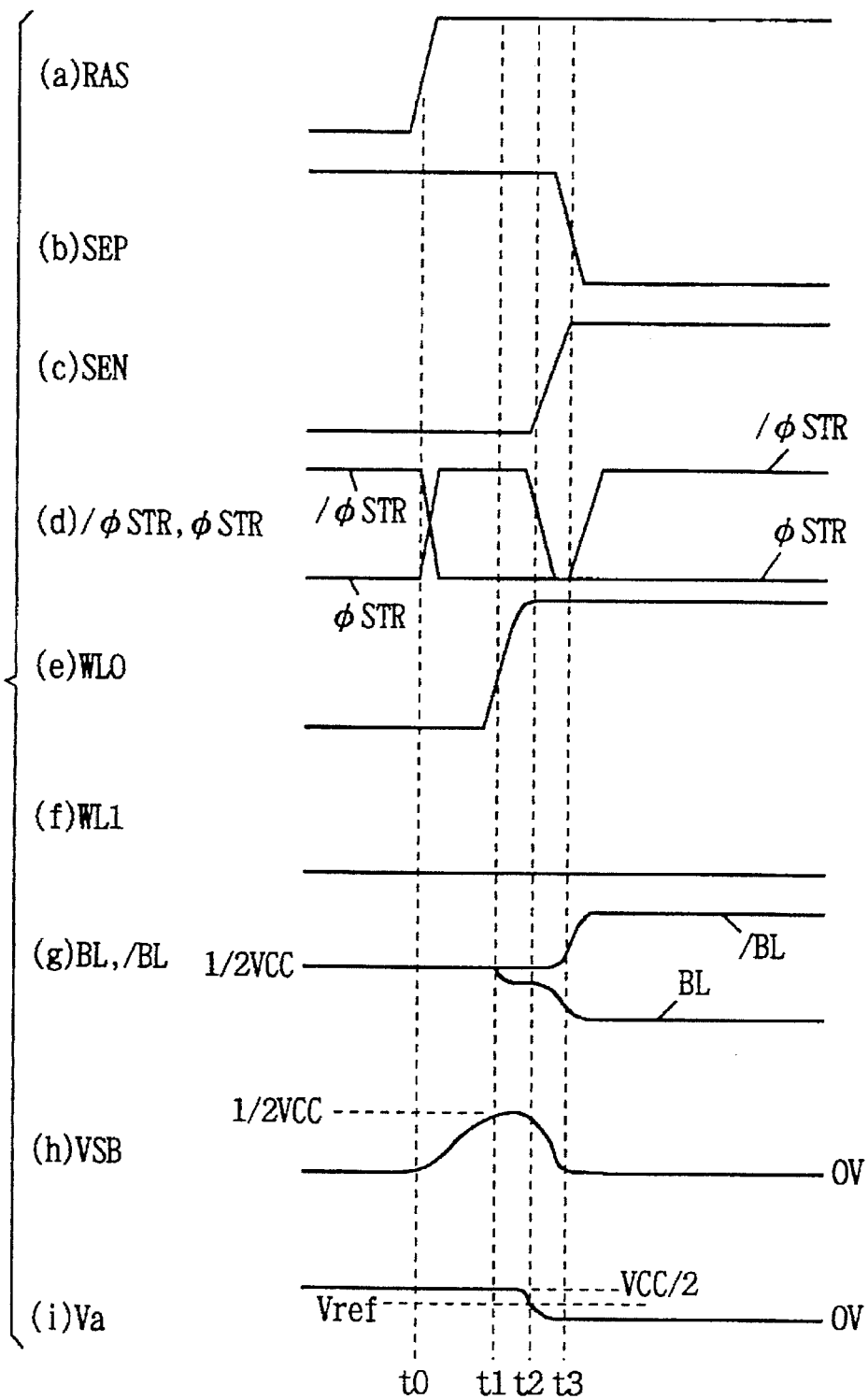
FIG. 2 is an operating waveform diagram representing the operation of the arrangement shown in FIG. 1.
Figure 3A:
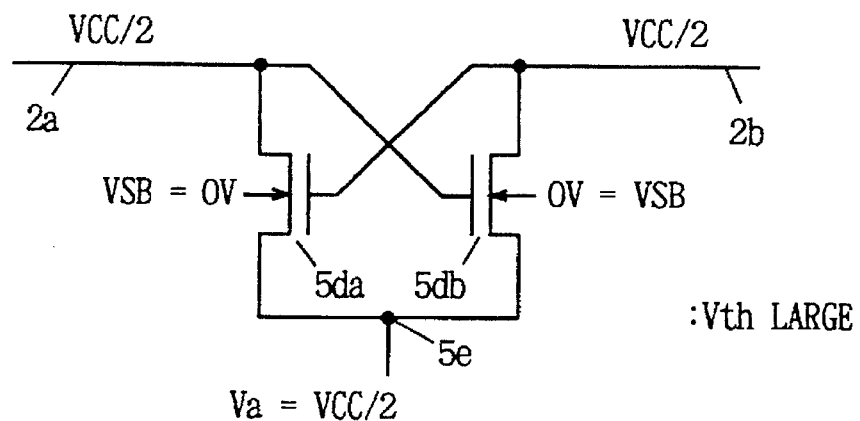
FIGS. 3A through 3C represent potentials at respective nodes of n channel sense amplifier upon sensing operation.
Figure 3B:
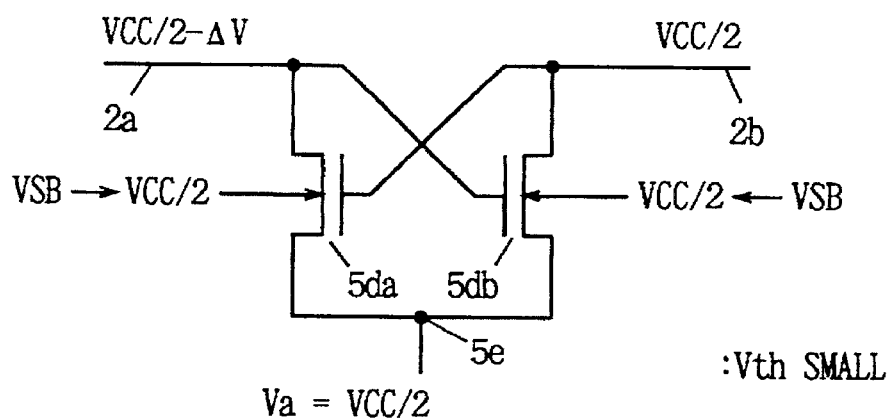
Figure 3C:
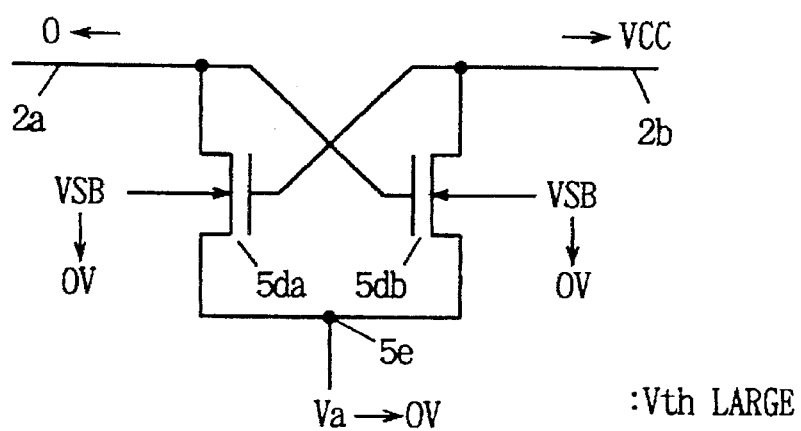
Figure 4:
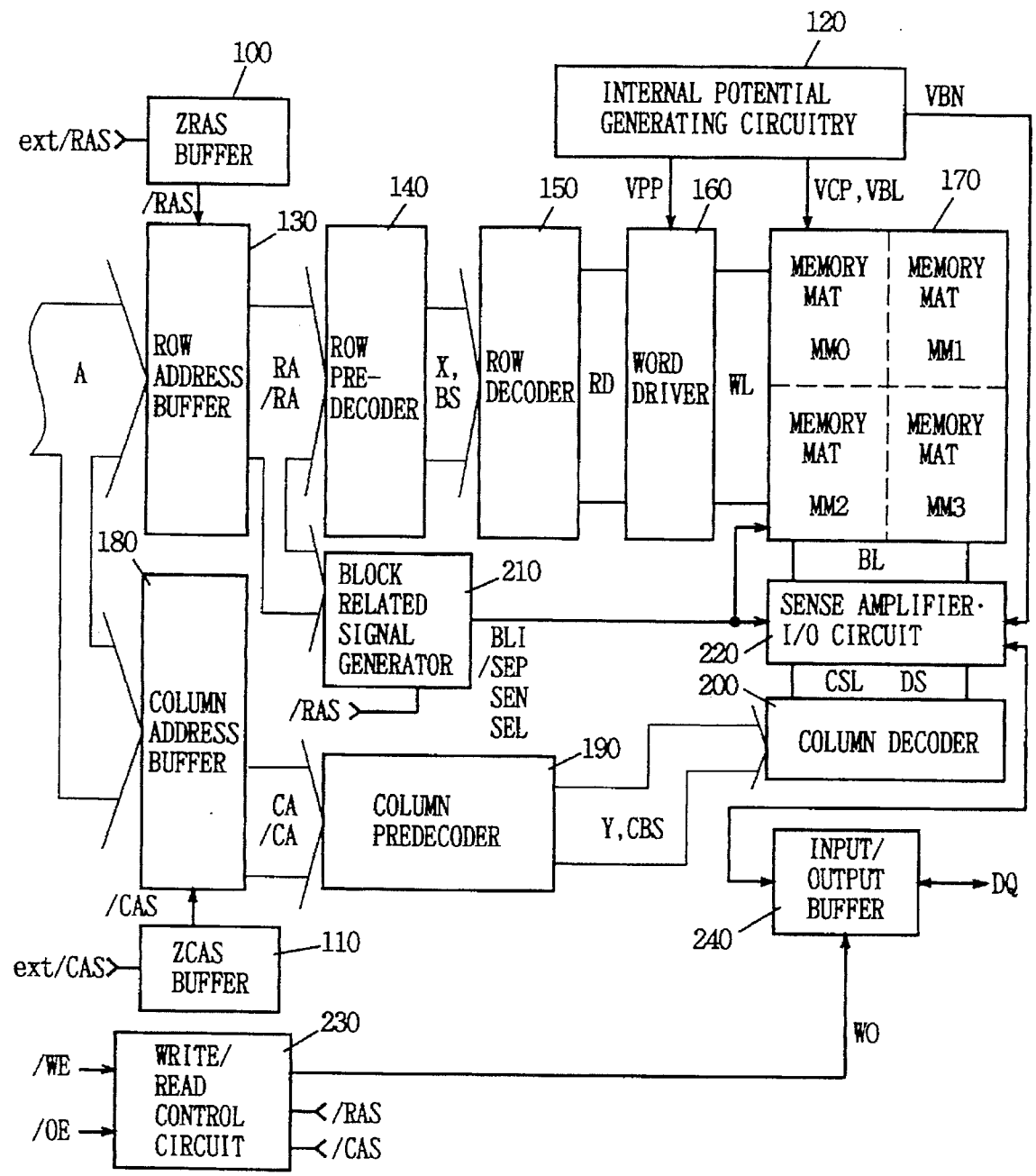
FIG. 4 shows a schematic overall arrangement of a semiconductor memory device according to the present invention.

FIG. 4 shows a construction of DRAM according to an embodiment of the present invention. Referring to FIG. 4, DRAM includes a memory array 170 partitioned into four memory mats MM0–MM3 each having a plurality of memory cells arranged in a matrix of rows and columns. The detailed structure of memory array will be described later.

DRAM further includes a ZRAS buffer 100 receiving and buffering an externally applied row address strobe signal ext/RAS for generating an internal row address strobe signal /RAS for various internal circuits (row selection related circuits), a ZCAS buffer 110 receiving and buffering an externally applied column address strobe signal ext/CAS for generating an internal column address strobe signal /CAS for various internal circuits (column selection related circuits). Signal /RAS defines a memory cycle period and determines a timing of starting a row selection operation. Signal /CAS determines a timing of starting a column selection operation and of reading out data when the signal /RAS is active.

DRAM further includes a row address buffer 130 responsive to internal row address strobe signal /RAS being active for incorporating an externally applied address signal A to generate an internal row address signal RA and a complemental internal row address signal /RA, a row predecoder 140 receiving and predecoding internal row address signals RA and /RA for generating a block select signal BS and a predecoded signal X, a row decoder 150 receiving block select signal BS and predecoded signal X for generating a row decode signal RD designating a row in a selected block designated by block select signal BS, and a word driver 160 receiving row decode signal RD for driving a selected row (word line) to a selected state at a boosted voltage VPP level.

As described later, memory mats MM0–MM3 each includes a plurality (32) of memory blocks, and block select signal BS selects eight memory blocks (two memory blocks in each memory mat) at a time, or eight of block select signals (BSj) are brought into an active state. Predecoded signal X includes 16 bit predecoded signals X0–X15, wherein one of the signals X0–X3 is made active in accordance with row address signals RA0, /RA0, RA1 and /RA1, one of predecoded signals X4–X7 is made active in accordance with row address signals RA2, /RA2, RA3 and /RA3, one of predecoded signals X8–X11 is made active in accordance with row address signals RA4, /RA4, RA5 and /RA5, and one of predecoded signals X12–X15 is made active in accordance with row address signals RA6, /RA6, RA7 and /RA7. Predecoded signals X0–X15 are generated in accordance with 8 bit row address signals RA0–RA7 (16 bits including complemental row address signals /RA–RA7), and therefore they designate one row among 256 rows in a memory block.

Block select signals BS is generated in accordance with row address signals RA8, /RA8–RA11, /RA11. Block select signal BS includes block select signals BS0–BS127 for respective memory blocks. Thus, eight memory blocks among 128 memory blocks are designated simultaneously. In general, memory mats MM0–MM3 all are activated simultaneously, and two memory blocks in each memory mat are designated at a time.

DRAM further includes a column address buffer 180 responsive to column address strobe signal /CAS being active for incorporating and latching an external address signal as a column address signal to generate an internal column address signal CA and a complemental internal column address signal /CA, a column predecoder 190 receiving and predecoding internal column address signals CA and /CA for generating a column block select signal CBS designating a column block in memory array 170 and a predecoded signal Y designating a column in a column block, and a column decoder 200 decoding predecoded signal Y and column block select signal CBS for generating a column select signal CSL designating a plurality of columns in memory array 170 and a data select signal DS designating a memory cell among the memory cells on the selected columns.

As described later, memory mats MM0–MM3 each are also divided into column blocks each including 128 columns, and one of column blocks is selected by column block select signal CBS in each memory mat.

Predecoded signal Y includes 12 bit predecoded signals Y0–Y11, wherein one of signals Y0–Y3 is made active in accordance with column address signals CA0, /CA0, CA1 and /CA1, one of predecoded signals Y4–Y7 is made active in accordance with column address signals CA2, /CA2, CA3 and /CA3, and one of predecoded signals Y8–Y11 is made active in accordance with column address signals CA4, /CA4, CA5 and /CA5. Block select signal CBS includes 64 bit block select signals CBS0–CBS63 for respective column blocks in the memory array 170. Data select signal DS selects one column block in accordance with column block select signal.

DRAM further includes sense amplifiers provided for bit lines (columns) for sensing, amplifying and latching memory cell data read out onto bit lines, a block related signal generator 210 responsive to row address strobe signal /RAS for decoding a block address signal received from row address buffer 130 for supplying a bit line isolation signal BLI, sense amplifier enable signals /SEP and SEN, and a selection signal SEL selecting a memory block for connection to a global I/O bus (described later), and I/O circuits responsive to column select signal CSL and data select signal for coupling a selected column (bit lines) to an input/output buffer 240. In FIG. 4, sense amplifiers and I/O circuits are collectively shown by a block 220.

As described later, sense amplifiers are arranged in an alternately arranged shared sense amplifier arrangement, only a memory block paired with a memory block including a selected row is isolated from sense amplifiers, and only the sense amplifiers provided for the memory block including the selected row are activated. Non-selected memory blocks are kept in an inactive (precharge) state. I/O circuits includes local IO lines provided for memory blocks and global I/O lines provided for respective column blocks.

DRAM further includes a write/read control circuit 230 responsive to address strobe signals /RAS and /CAS, a write enable signal /WE and an output enable signal /OE for supplying a write/read control signal WO indicating which of data reading and data writing should be performed to input/output buffer 240, and internal potential generating circuitry 120 for generating the boosted potential VPP higher than the operational power supply potential, a bit line precharge potential VBL at the intermediate potential, a cell plate potential Vcp at the intermediate potential, and a well potential VBN supplied to a well on which a sense amplifier is formed.

Well potential (n channel backgate) potential VBN changes between the intermediate potential (Vcc+Vss)/2 and the sum of intermediate potential and a PN junction diffusion potential $\phi$.

Figure 5:
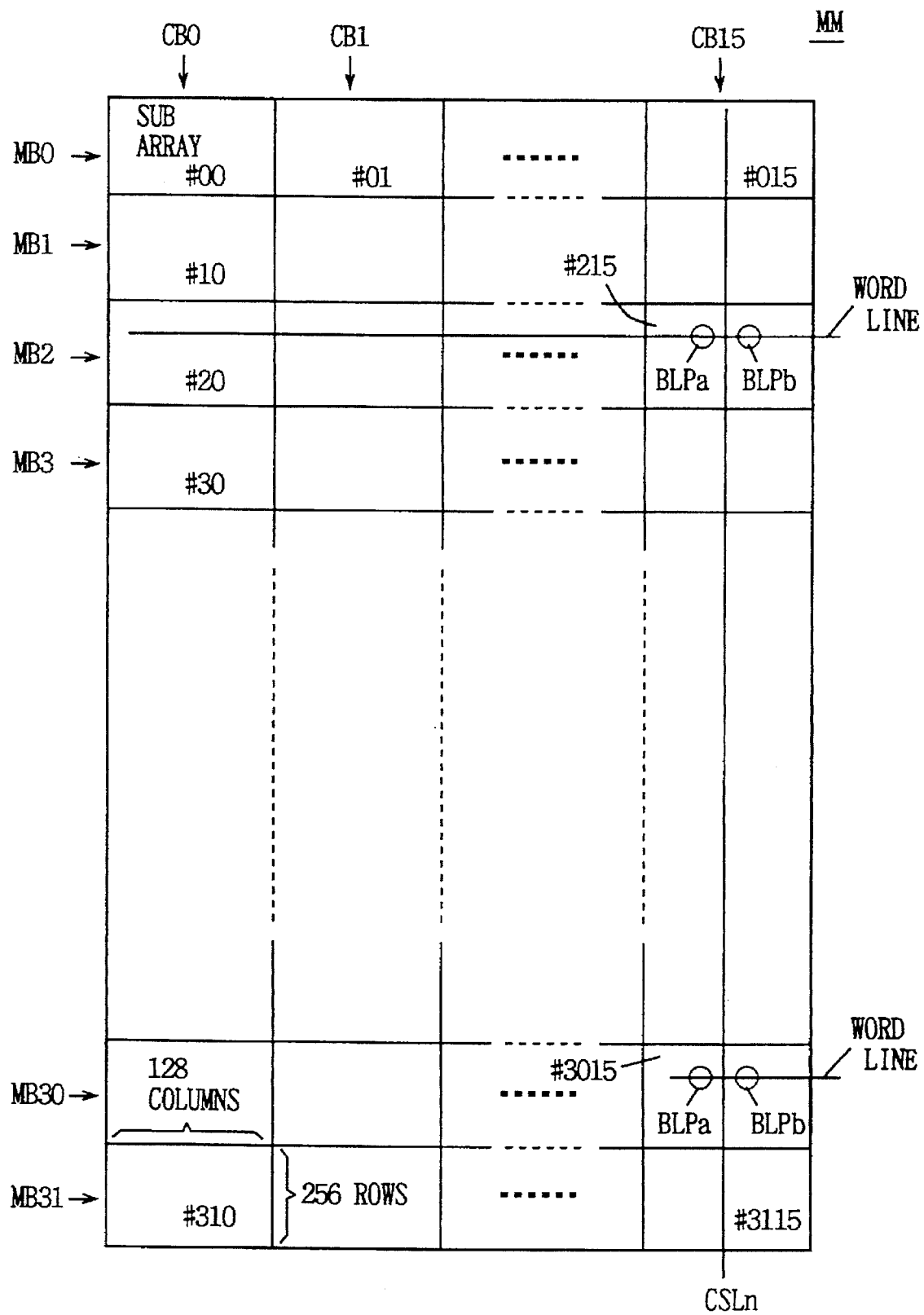
FIG. 5 shows a schematic arrangement of a memory mat in the memory array shown in FIG. 4.

FIG. 5 shows an arrangement of a memory mat MM in memory array 170. Referring to FIG. 5, a memory mat MM (any of MM0–MM3) includes a plurality of subarrays #00–#3115 arranged in 32 rows and 16 columns. Subarrays #i0–#i15 on a row constitute a memory block MBi, and subarrays #0j–#31j on a column constitute a column block CBj. Each of subarrays #00–#3115 includes memory cells arranged on 256 rows and 128 columns. Memory mat MM includes 32 memory blocks MB0–MB31 and 16 column blocks CB0–CB15.

In operation, two memory blocks are selected at a time in accordance with block select signal BS, and a column block is selected in accordance with column block select signal CBS. A column select line CSLn from column decoder 200 (FIG. 4) extends over memory mat MM in a column direction and selects two columns in respective subarrays in a selected column block (CB15 in FIG. 5). Thus, 4 columns or bit line pairs BLPa and BLPb are selected simultaneously in total because two memory blocks (MB2 and MB30) are selected, and then one bit line pair (one bit memory cell) is selected by data select signal DS.

Figure 6:
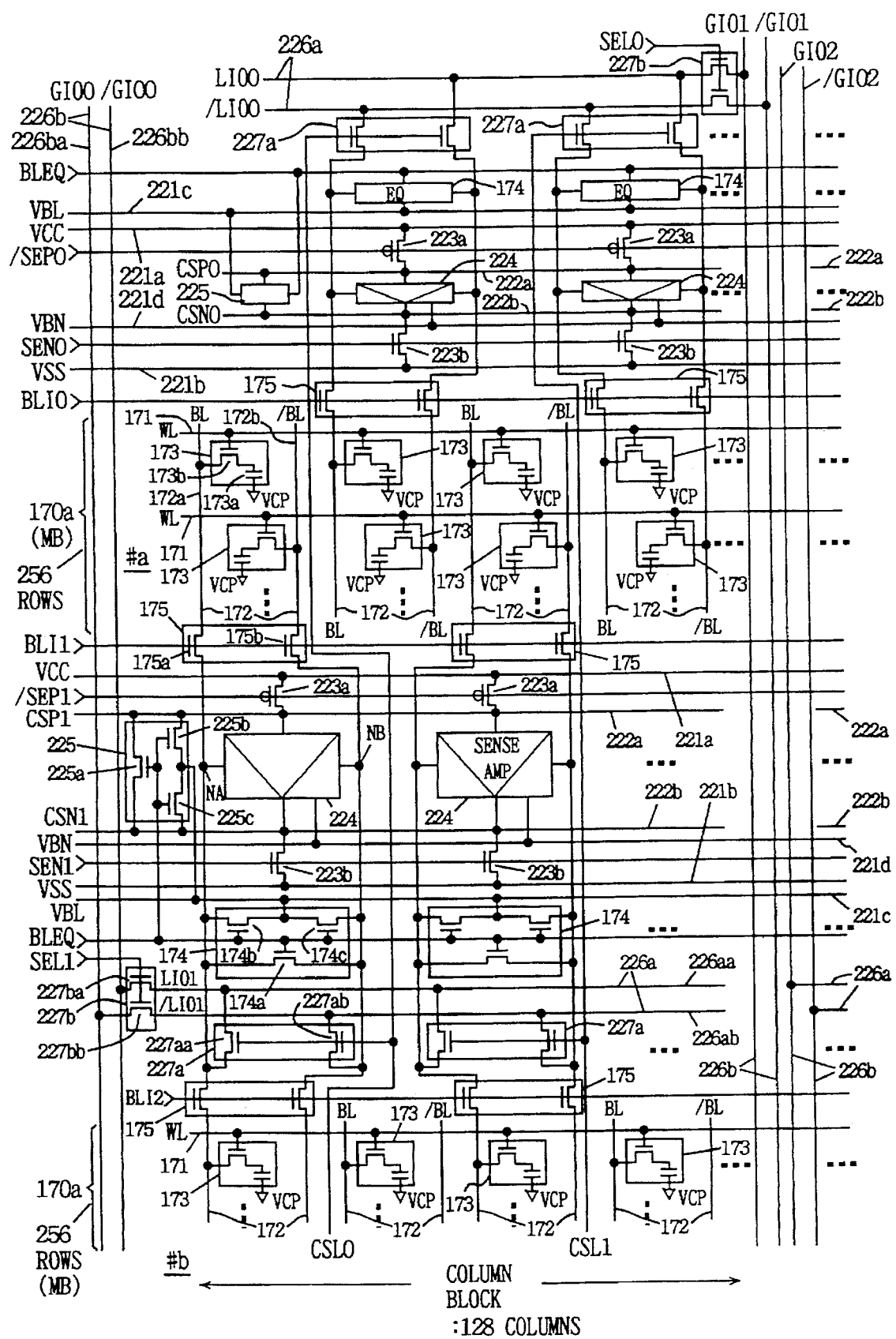
FIG. 6 shows a schematic detailed arrangement of a subarray and related peripheral circuitry shown in FIG. 5.

FIG. 6 shows a detailed configuration of memory array 170 of FIG. 4, and two subarrays #a and #b, and related peripheral circuitry are representatively shown.

Subarrays #a and #b each include a plurality of memory cells 173 arranged in 256 rows and 128 columns, a plurality (256) of word lines 171 provided corresponding to respective rows and connecting memory cells 173 on corresponding rows, and a plurality of bit line pairs 172 provided corresponding to respective columns and connecting memory cells on corresponding columns.

Memory cell 173 includes a capacitor 173a having a cell plate electrode receiving cell plate potential Vcp at intermediate potential of (Vcc+Vss)/2 and a storage node storing information in a form of electric charges, and a memory transistor 173b responsive to a potential WL on a corresponding word line for coupling the storage node to a bit line of a corresponding bit line pair 172.

Bit line pair 172 includes bit lines 172a and 172b transmitting data signals BL and /BL complementary to each other. Memory cell 173 is located corresponding to a crossing of bit line 172a or 172b and a word line 171.

Bit lines 172a and 172b extend only within a corresponding subarray #a or #b, while word line 171 extends all over the subarrays in a corresponding memory block 170a (MB).

Sense amplifiers 224 are arranged in a row on both sides of subarrays #a and #b. In FIG. 6, sense amplifiers 224 on both sides of subarray #a are representatively shown.

In subarrays #a, bit line pairs 172 on even columns are coupled to sense amplifiers 224 at an upper side through bit line isolation gates 175 responsive to a (bit line isolation) control signal BLI0, and bit line pairs 172 on odd columns are coupled to sense amplifiers 224 at a lower side through bit line isolation gates 175 responsive to a control signal BLI1.

Bit line pairs 172 on odd columns in subarray #b are coupled to sense amplifiers 224 on the lower side through bit line isolation gates 175 responsive to a control signal BLI2.

Bit line isolation gate 172 includes a transfer gate 175a for connecting bit line 172a to a sense node NA and a transfer gate 175b for connecting bit line 172b to a sense node NB both in response to an associated bit line isolation control signal BLI.

Bit line precharge/equalize circuit (EQ) 174 are arranged in a row in correspondence to sense amplifiers 224. Bit line precharge/equalize circuit 174 precharges and equalizes corresponding bit line pair through sense nodes NA and NB to the intermediate potential, and includes a transfer gate 174a for electrically coupling sense nodes NA and NB with each other, a transfer gate 174b for transferring the bit line precharge potential VBL on a bit line precharge line 221c arranged over a memory mat, and a transfer gate 174c for transferring the bit line precharge potential VBL to sense node NB.

For each respective sense amplifier 224, a pull up transistor 223a of p channel MOS transistor and a pull down transistor 223b are provided. Pull up transistor 223a responds to an associated sense amplifier enable signal /SEP (/SEP0 . . . ) for coupling a power supply line 221a arranged over a memory mat to a p common source node of a corresponding sense amplifier 224, and pull down transistor 223b responds to an associated sense amplifier enable signal SEN for coupling a ground line 221b arranged over the memory mat to an n common source node of the corresponding sense amplifier 224. The p common source nodes of sense amplifiers 224 are connected together through a p channel common source line 222a, and n common source nodes of sense amplifiers 224 are intercoupled through an n channel common source line 222b.

Backgate potential VBN is applied to a p well region of each of sense amplifiers through an n channel backgate potential line 221d extending over a memory block.

P and n channel common sources lines 222a and 222b extending only over a subarray and are separated from those in an adjacent subarray in the same memory block.

Between p and n channel common source lines 222a and 222b, a common source line precharge circuit 225 is provided which responds to bit line equalize signal BLEQ for transmitting the precharge potential VBL onto the common source lines 222a and 222b.

Two pairs 226a of local I/O lines 226aa and 226ab are provided for the subarray #a, one pair on the upper side, and another pair on the lower side. A pair of local I/O lines are shared between two subarrays adjacent in the same column block. The local I/O line pair 226a at the lower side is shared between subarrays 4a and 4b, for example.

Global I/O line pair 226b including lines 226ba and 226bb is arranged extending over subarrays of a common column block. Although 4 pairs of global I/O lines 226ba and 226bb are provided for a column block, only two pairs of global I/O lines are typically shown because two pairs of global I/O lines are provided for 16 memory blocks.

A local I/O gate circuit 227a is provided for each pair of sense nodes NA and NB of sense amplifiers 224, which couples the pair of sense nodes NA and NB to a corresponding local I/O line pair 226a in response to column select signal CSL. The gate circuit 227a includes a transfer gate 227aa for coupling bit line 172a and local I/O line 226aa in response to column select signal CSL, and a transfer gate 227ab for coupling bit line 172b and local I/O line 226ab in response to column select signal CSLa.

Between local I/O line pair 226a and global I/O line pair 226b, a global I/O circuit 227b is provided which couples local I/O line pair 226a and global I/O line pair 226b in response to selection signal SEL (SELr: r=0~63) and includes a transfer gate 227ba for coupling local I/O line 226aa and global I/O line 226ba, and a transfer gate 227bb for coupling local I/O line 226ab and global I/O line 226bb.

Power supply potential Vcc on line 221a may be an externally applied power supply potential or may be an internal power supply potential produced by down-converting the externally applied power supply potential. Ground potential Vss may be an externally applied ground potential or may be an internal ground potential produced by up-converting the external ground potential as in a virtual ground system or a hierarchical power line arrangement. Now, operation of DRAM shown in FIGS. 4 to 6 will be described with reference to FIG. 7 of an operational waveform diagram indicating the operational sequence when L level data is read out.

Write enable signal /WE is made high and output enable signal /OE is made low, and data read mode is designated.

Figure 7:
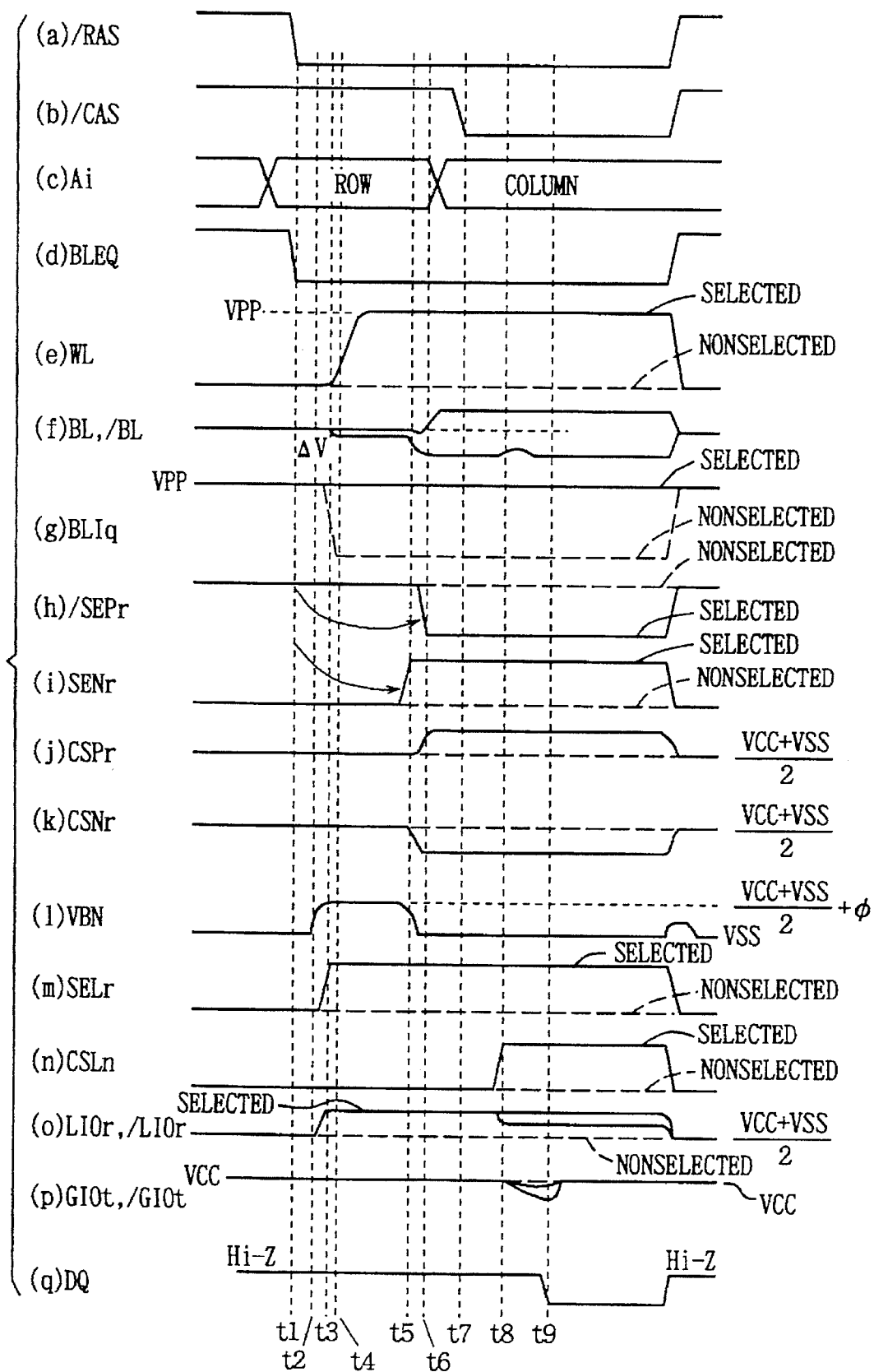
FIG. 7 is a waveform diagram depicting the operation of the memory device shown in FIGS. 4 through 6.

Prior to time t1 at which row address strobe signal RAS changes from H level to L level as shown at (a) in FIG. 7, bit line equalize signal BLEQ is at H level as shown at (d) in FIG. 7, and bit line isolation signals BLIq (q=0~511) are all at H level of boosted potential Vpp as shown at (g) in FIG. 7. Thus, MOS transistors 174a, 174b and 174c in bit line precharge/equalize circuit 174 and MOS transistors 175a and 175b in shared amplifier gate circuit 175 are all made conductive, and potentials BL and /BL on bit line pair 172 are precharged to bit line precharge potential VBL at (Vcc+Vss)/2 by bit line precharge circuit 174, as shown at (f) in FIG. 6.

P channel sense amplifier enable signals /SEPr are all at H level as shown at (h), and n channel sense amplifier enable signal SENr are all at L level as shown at (i) in FIG. 7, and therefore pull up transistors 223a and pull down transistors 223b are all turned off. Since MOS transistors 225a, 225b and 225c receiving H level bit line equalize signal BLEQ in common source line equalize circuit 225 are turned on, potentials CSPr of p channel common source line 222a and potentials CSNr of n channel common source line 222b are equalized to intermediate potential (Vcc+Vss)/2 by common source lines equalize circuit 225. N channel backgate potential VBN is at ground potential Vss as shown at (l) in FIG. 7.

Potentials WL on word lines 171 are all at L level as shown at (e) in FIG. 7. Selection signals SELr for selectively connecting global I/O line pair to local I/O line pair in accordance with a row address signal are all at L level as shown at (m) in FIG. 7, and column select signals CSLn are all at L level as shown (n) in FIG. 7. Potentials LIOr and /LIOr of local I/O line pair are equalized and precharged to (Vcc+Vss)/2 as shown at (o) in FIG. 7, and potentials GIOt, /GIOt (t=0–255) of global I/O line pair 22bb are equalized and precharged to power supply potential Vcc as shown at (p) in FIG. 7, and data DQ is at a high impedance state (Hi-Z state) as shown at (q) in FIG. 7.

Address signal Ai is established into a row address as shown at (c) in FIG. 7, and row address strobe signal /RAS is changed from H level to L level at time t1 as shown at (a) in FIG. 6. Responsively, bit line equalize signal BLEQ changes from H level to L level, and precharging and equalizing of bit line pair 172 and common source lines 222a and 222b are stopped.

In response to the fall of row address strobe signal /RAS, n channel backgate potential VBN rises to a precharge potential VPRN at (Vcc+Vss)/2+φ at time t2 as shown at (l) in FIG. 7, to decrease the threshold voltage of n channel MOS transistors in sense amplifiers 224.

Bit line isolation signal BLIq for a memory block 170a (MB) selected by the row address signal (block select signal BS) is kept at boosted potential Vpp as shown at (g) in FIG. 7. Bit line isolation signal for a nonselected memory block sharing sense amplifiers with the selected memory block is made low at time t3, and this non-selected memory block is isolated from the sense amplifiers as shown at (g) in FIG. 7. Other non-selected memory blocks are coupled to corresponding sense amplifiers. Select signal SELr for a memory block including a word line selected by row address signal goes high substantially at time t3 to turn on MOS transistors 227ba and 227bb in global I/O gate circuit for connecting corresponding local I/O lines 226a and corresponding global I/O lines 226b. Potentials LIOr, /LIOr of the local I/O line pair 226 precharged to (Vcc+Vss)/2 are raised up to potential Vcc of the corresponding global I/O line, pair as shown at (o) in FIG. 7.

Potential WL of a word line 171 selected by the row address signal is raised up to boosted potential Vpp by word driver 160 at time t4, as shown at (e) in FIG. 7. Then, memory transistor 123b in memory cell 173 connected to the selected word line 171 is turned on, and electric charges are transferred between memory capacitor 173a of the selected memory cell and a corresponding bit line 172a or 173b.

Potential BL or /BL changes from bit line precharge potential VBL by ΔV, as shown at (f) in FIG. 7.

Sense amplifier enable signal SENr for the selected memory block 170a is raised to H level at time t5 as shown at (i) in FIG. 7, and responsively pull down transistor 223b becomes conductive, and potential CSNr of n channel common source line 222b for the selected memory block is pulled down to ground potential, as shown at (k) in FIG. 7.

Backgate potential VBN is at (Vcc+Vss)/2+φ and NMOS transistors in the sense amplifiers each have a very small threshold voltage due to the backgate effect, and these MOS transistors soon turn on immediately after the lowering of the potential CSNr, and fast sensing operation can be provided. The potential VBN is pulled down from the potential VPRN (=(Vcc+Vss)/2+φ) to ground potential Vss following (tracing) the lowering of the potential CSNr as shown at (l) in FIG. 7.

In response to the fall of the potential SCNr at time t5, sense amplifiers 224 for the selected memory block starts sensing operation to pull down the potential BL lower than the potential /BL to ground potential Vss. The potential /BL is lowered a little by this sensing operation, as shown at (f) in FIG. 7.

Sense amplifier enable signal /SEPr for the selected memory block goes low at time t6 as shown at (h) in FIG. 7, to turn on associated pull up transistors 223a, and potential CSPr of p channel common source line 222a is pulled up to power supply potential Vcc, as shown at (j) in FIG. 7. Potential /BL of a bit line at a higher potential is raised up to power supply potential Vcc by sense amplifiers 224 activated by the application of power supply potential through pull up transistors 223a.

When potentials BL and /BL are changed to ground potential Vss and power supply potential Vcc, sensing operation is completed, and potentials BL and /BL are latched by sense amplifiers 224.

Address signal Ai is established into a column address signal as shown at (c) in FIG. 7, and column address strobe signal /CAS is changed from H level to L level at time t7 as shown in FIG. 7. Column select signal CSLn selected (designated) by the column address signal is raised to H level at time t8 as shown at (q) in FIG. 7 to make conductive MOS transistors 227aa and 227ab in associated local I/O gate circuit 227a to connect corresponding local I/O line pairs 226a and corresponding bit line pairs 172. Potentials Vcc and Vss on the bit line pair 172 are transmitted to the corresponding local I/O line pair 226a, and potential /LIOr on the corresponding local I/O line 226ab is reduced to a clamp level from power supply potential, as shown at (0) in FIG. 7. Potentials on the local I/O line pair 226a are transmitted to a corresponding global I/O line pair 226b, and a potential difference is developed therebetween as shown at (p) in FIG. 7.

Potentials GIOt, /GIOt on the global I/O line pair 226b are shifted down by a not shown level shifter, as shown at (p) in FIG. 7, to make large a gain of a not shown preamplifier which in turn amplifies the potential difference thereon onto input/output buffer 240. Input/output buffer 240 supplies data DQ at L level at time t9 as shown at (f) in FIG. 7.

In the present invention, n channel backgate potential VBN is made higher than intermediate potential to reduce the threshold voltage of n channel MOS transistors in sense amplifier 224. Thus, immediately after activation of sense amplifier enable signal SEN (SENr), sense amplifier can be operated to start sensing operation.

Figure 8:
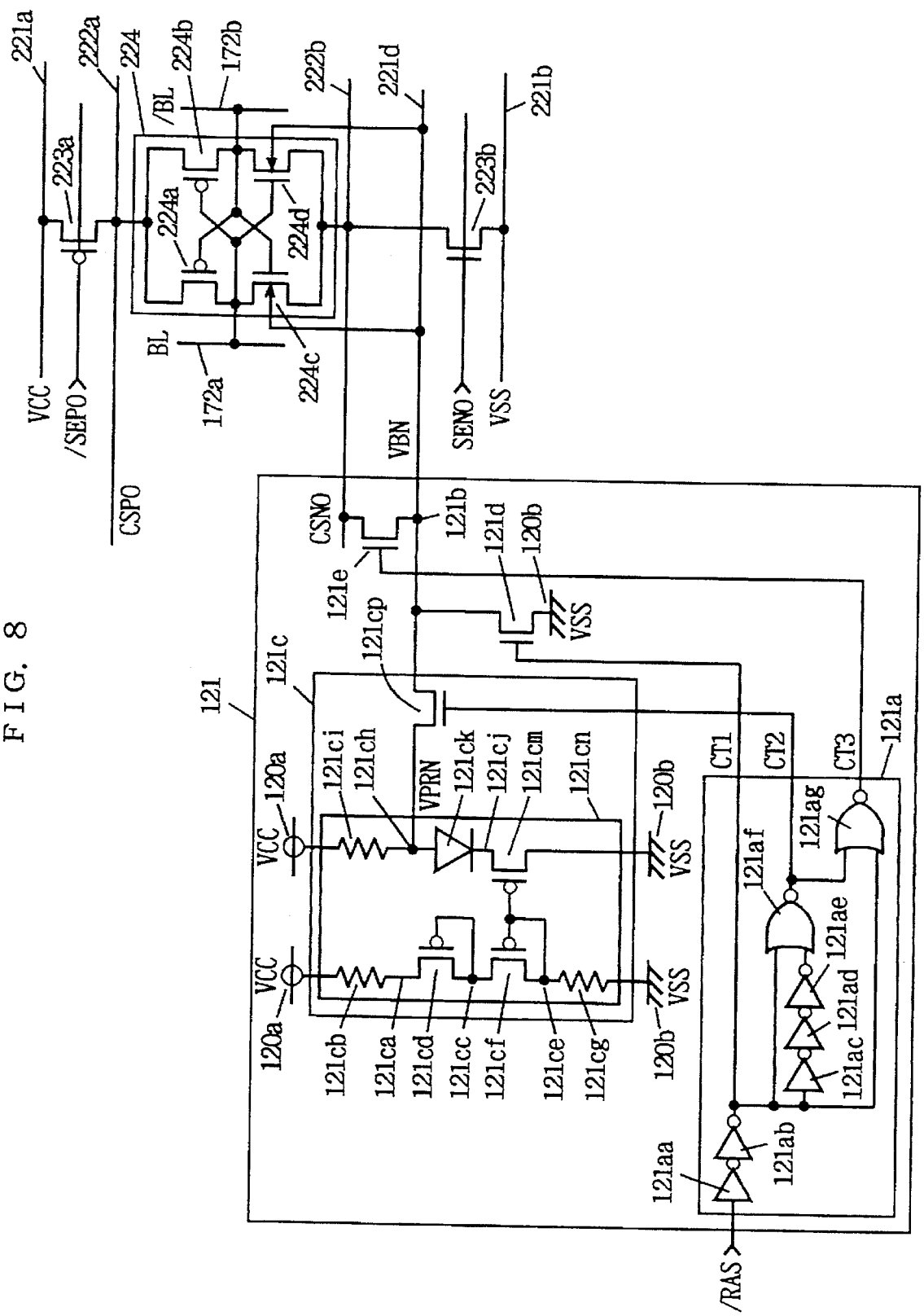
FIG. 8 shows a specific arrangement of a sense amplifier and a related peripheral circuit according to the first embodiment of the present invention.

FIG. 8 shows a specific arrangement of a backgate potential generator generating the backgate potential VBN for a memory block MB0. FIG. 8 also shows a specific arrangement of sense amplifier 224.

Referring to FIG. 8, sense amplifier 224 includes a p channel MOS transistor 224a connected between bit line 172a and p channel common source line 222a and having a gate connected to bit line 172b, a p channel MOS transistor 224b connected between p channel common source line 222a and bit line 172b and having a gate connected to bit line 172a, an n channel MOS transistor 224c connected between n channel common source line 222b and bit line 172a and having a gate connected to bit line 172b, and an n channel MOS transistor 224d connected between n channel common source line 222b and bit line 172b and having a gate connected to bit line 172a. P channel MOS transistors 224a and 224b constitute a cross coupled P sense amplifier for pulling up a higher potential bit line to power supply potential Vcc, and n channel MOS transistors 224c and 224d constitute a cross coupled N sense amplifier for pulling down a lower potential bit line to ground potential.

N channel MOS transistors 224c and 224d also have their backgates receiving n channel backgate potential VBN. A p channel MOS transistor 223a is connected between power supply line 223a and p channel common source line 222a and having a gate receiving p sense amplifier enable signal /SEP0 (/SEPr). An n channel MOS transistor 223b is connected between ground line and n channel common source line 222b and having a gate receiving a sense amplifier enable signal SEN0 (SENr).

N channel backgate potential generator 121 is included in internal potential generating circuitry 120 shown in FIG. 4. The generator 121 includes a backgate potential controller 121a generating three control signals CT1, CT2 and CT3 in response to internal row address strobe signal /RAS, an n channel precharge potential supply circuit 121c operating with power supply potential Vcc at a node 120a and ground potential Vss at a node 120b as operating power source potentials and responsive to control signal CT2 for generating n channel precharge potential VPRN onto an n channel backgate potential output node 121b, n channel MOS transistor 121d connected between ground node 120b and the output node 121b and having a gate receiving control signal CT1, and an n channel MOS transistor 121e connected between n channel common source node (line) 222b and the output node 121b and having a gate receiving control signal CT3.

Backgate potential controller 121a includes cascaded two inverters 121aa and 121ab receiving and delaying row address strobe signal /RAS for generating control signal CT1, cascaded three inverters 121ac, 121ad and 121ae receiving and inverting the output of inverter 121ab, or control signal CT1, a NOR gate 121af receiving control signal CT1 and the output of inverter 121ae for generating control signal CT2, and a NOR gate 121ag receiving the outputs CT1, CT2 of NOR gate 121af and inverter 121ab for generating control signal CT3.

N channel precharge potential supply circuit 121c includes a resistance element 121cb connected between power supply node 120a and a node 121ca, a p channel MOS transistor 121cd connected between nodes 121a and 121cc and having a gate connected to node 121cc, a p channel MOS transistors 121cf connected between node 121cc and a node 121ce and having a gate connected to node 121ce, and a resistance element 121cg connected between node 121ce and ground node 120b. Resistance elements 121cb and 121cg have the same resistance value, and MOS transistors 121cd and 121cf have the same size. Resistance value of resistance elements is set sufficiently larger than on-resistance (channel-resistance) of MOS transistors 121cd and 121cf, and MOS transistors 121cd and 121cf operate in a diode mode. Thus, a potential at node 121cc is (Vcc+Vss)/2.

N channel precharge potential supply circuit 121c further includes an n channel precharge potential generator 121cn generating the n channel precharge potential VPRN and including a resistance element 121ci connected between power supply node 120a and a node 121ck, a diode 121ck having an anode connected to node 121ch and a cathode connected to a node 121cj, and a p channel MOS transistor 121cm connected between node 121cj and ground node 120b and having a gate connected to node 121ce. N channel MOS transistor 121cp responsive to control signal CT2 is connected between nodes 121ch and 121b. Diode 121ck is formed of a PN junction diode, for example, and causes a voltage drop of pn junction diffusion potential $\phi$ thereacross. P channel MOS transistor 121cm operates in a source follower mode and keeps its source to gate potential difference at the absolute value of its threshold voltage Vthp. MOS transistors 121cd, 12cf and 121cm are assumed to have the same threshold voltage Vthp. Then, the potential VPRN can be represented by:

$$VPRN=(Vcc+Vss)/2-|Vthp|+|Vthp|+\phi=(Vcc+Vss)/2+\phi.$$

Now, operation of FIG. 8 arrangement will be described with reference to an operation waveform diagram of FIG. 9.

Before time t1, the signal /RAS is at H level, and the memory device is in a standby state. Bit line equalize signal BLEQ is at H level as shown at (b) in FIG. 9, and potentials CSP0 and CSN0 are kept at intermediate level. Sense amplifier enable signal /SEP0 is at H level, and sense amplifier enable signal SEN0 is at L level, and MOS transistors 223a and 223b are turned off.

Figure 9:
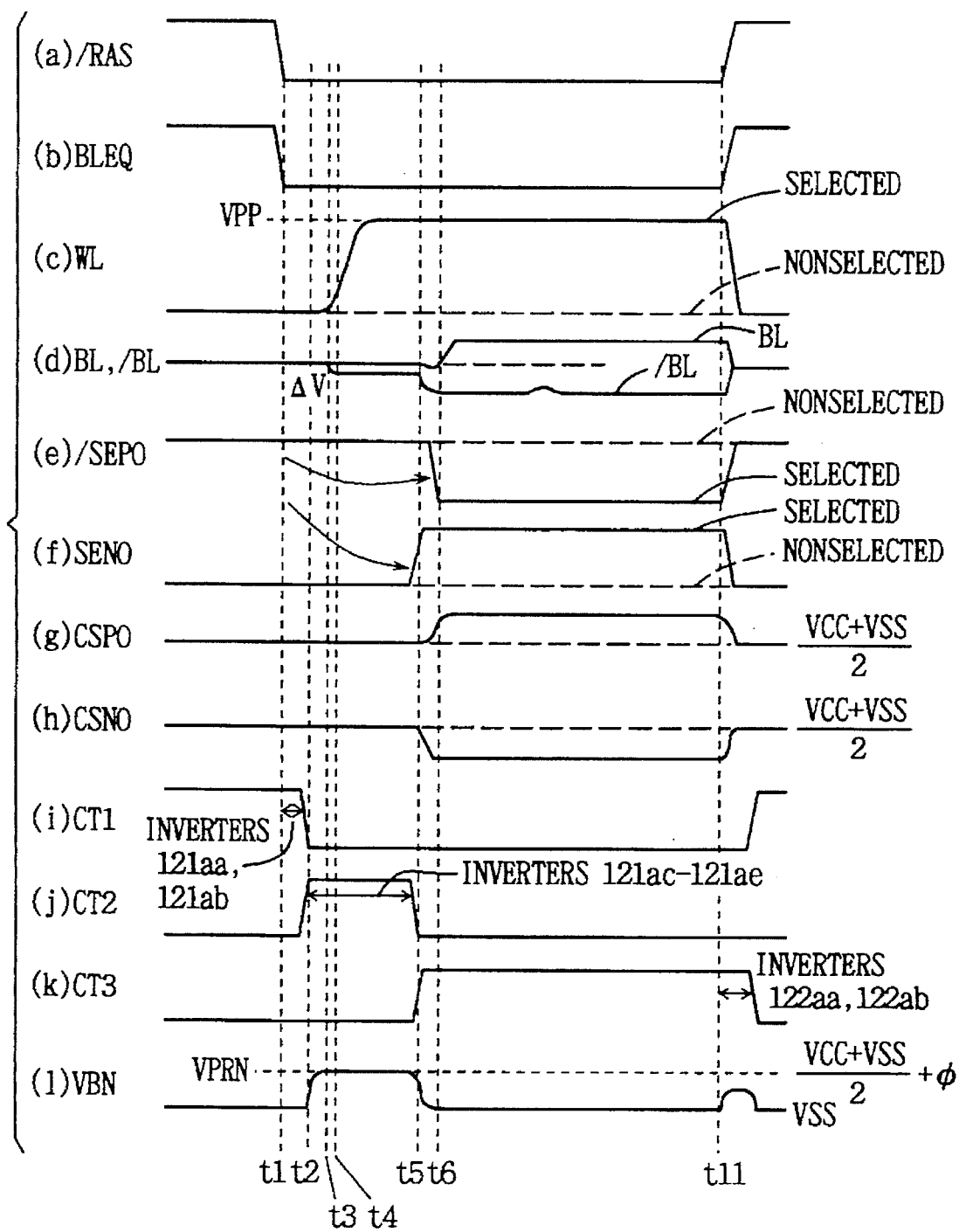
FIG. 9 is an operational waveform diagram representing the operation of the arrangement of FIG. 8.

Since row address strobe signal /RAS is inactive at H level, control signal CT1 is at H level, and control signals CT2 and CT3 are at L level as shown at (h)–(j) in FIG. 9. Thus, MOS transistor 121d turns on to pull down the potential VBN at ground potential Vss as shown at (l) in FIG. 9.

When row address strobe signal /RAS goes low at time t1, the signal BELQ is pulled down to L level as shown at (b) in FIG. 9, and common source liens 222a and 222b are brought into an electrically floating state. A word line selection operation is carried out, and potential WL of a selected word line starts to go high at a time between times t2 and t3.

In response to the fall of row address strobe signal RAS, control signal CT1 from inverters 121aa and 12ab goes low at time t2 as shown at (i) in FIG. 9, to turn off MOS transistor 121d.

In response to the fall of control signal CT1, control signal CT2 is made high for a predetermined time determined by the delay time of inverters 121ac–121ae. In FIG. 9, control signal CT2 is at H level between times t1 and t4. Responsively, MOS transistor 121cp turns on to transmit the precharge potential VPRN to the node 121b, and n channel backgate potential VBN is set at the potential VPRN. MOS transistors 224c and 224d have their threshold voltages reduced.

According to the rise of potential of the selected word line at time t2, potential difference between BL and /BL is developed.

After a predetermined time has passed since the rise of control signal CT2 or the fall of control signal CT1 at time t1, control signal CT2 is brought to L level at time t5, and MOS transistor 121cp is turned off to inhibit transmission of the precharge potential VPRN to the backgate line (node) 221d. On the other hand, control signal CT3 from NOR gate 121ag goes high at time t4 in response to the fall of control signal CT2 as shown at (k) in FIG. 9, and MOS transistor 121e turns on to connect n channel common source line 222b to the backgate line 221d.

MOS transistors 224c and 224d each have the source potential and the backgate potential equal to each other.

At time t5, the sense amplifier enable signal SEN0 is made high at time t4 to turn on MOS transistor 223b. Potential CSN0 on n channel common source line 222b is pulled down to ground potential. Since the threshold voltages of MOS transistors 224c and 224d are made small, a lower bit line potential /BL is pulled down through MOS transistor 224d and MOS transistor 223d immediately after MOS transistor 223b turns on, to lower the potential CSN0. During discharging or sensing operation, MOS transistor 121e is turned on to couple the backgate and source of each of MOS transistors 224c and 224d, and the backgate potential VBN is lowered to ground potential following (tracing) the lowering of the common source line potential. Threshold voltage of MOS transistor 224c and 224d should be kept as small as possible upon sensing operation, and sense amplifier enable signal SEN0 is activated before the turn on of MOS transistor 121e. However, the rising of signals SEN0 and CT3 may be made at the same timing, or the sense amplifier enable signal SEN0 is made active after the rise of control signal CT3. It is sufficient that potential VBN is higher than potential CSN0 upon starting of sensing operation.

At time t6, p sense amplifier enable signal /SEP0 is made low as shown at (e) in FIG. 9, and MOS transistor 223a is turned on to activate p sense amplifier (transistors 224a and 224b). Potential BL is raised to power supply potential Vcc. After sensing operation is completed, bit line potentials BL and /BL are brought to ground potential Vcc and power supply potential Vcc and are latched. Then, data read operation as described previously is performed.

When row address strobe signal /RAS goes high at time t11 as shown at (a) in FIG. 9, a memory cycle is completed and these potentials returns to those at precharge states or in a standby state. The rise of potential VBN at time t7 is caused by the equalize and precharge of common source lines 222a and 222b because MOS transistor 121e is conductive in accordance with control signal CT3.

With a delay of inverters 121aa and 121ab to the rise of row address strobe signal /RAS, control signal CT3 goes low and control signal CT1 goes high as shown at (i) and (k) in FIG. 9, and MOS transistor 121e turns off, and MOS transistor 121d turns on to pull down the potential VBN to ground potential Vss.

Figure 10A:
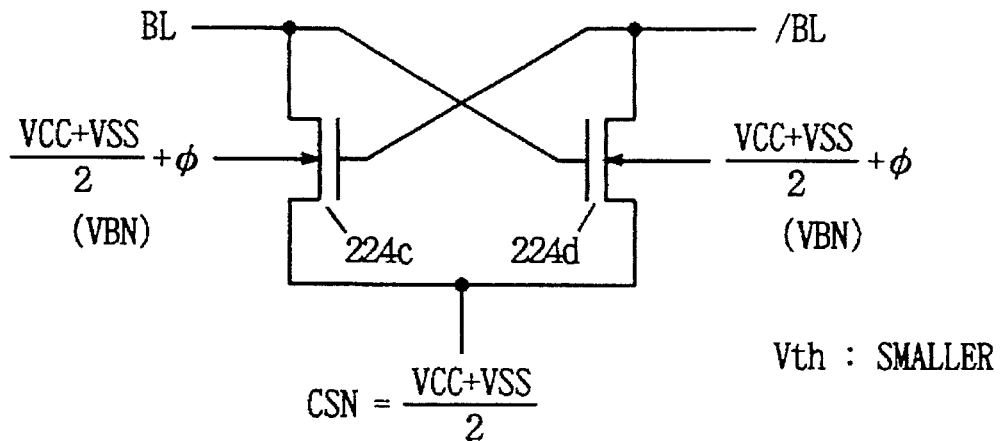
FIG. 10A shows potentials at respective nodes of NMOS sense amplifier prior to sensing operation.
Figure 10B:
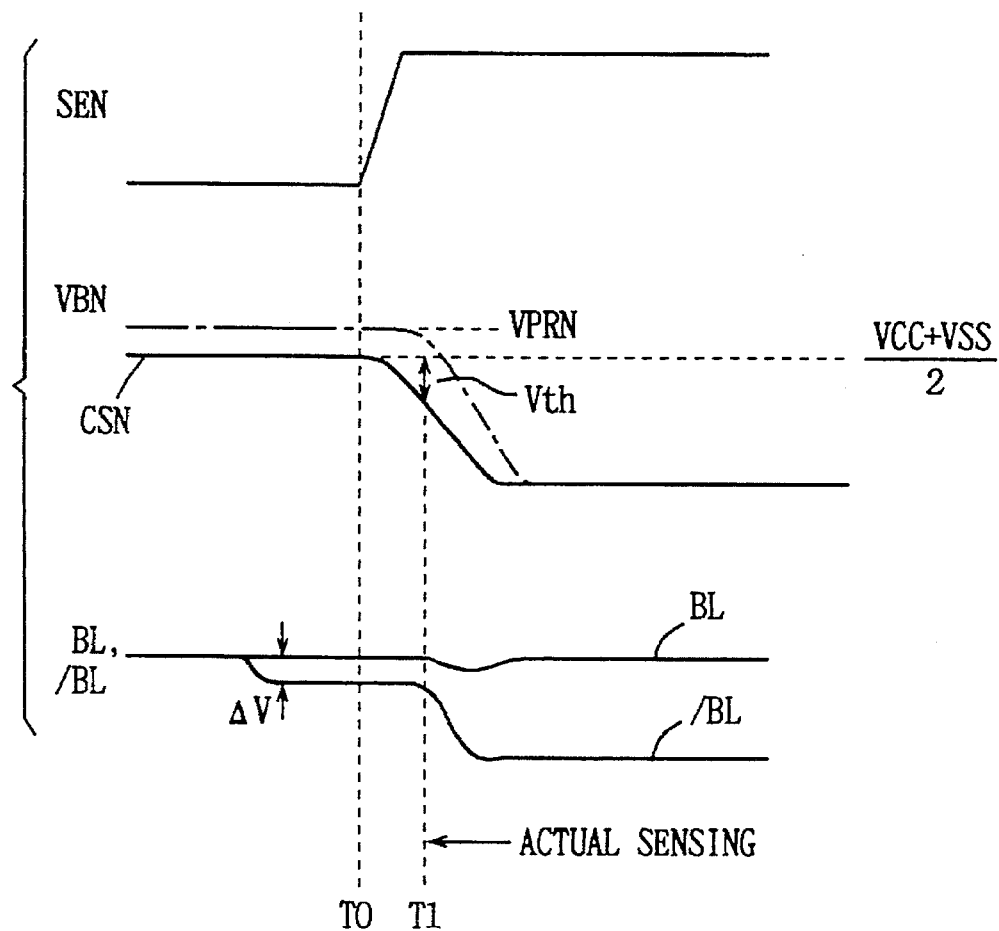
FIG. 10B is an operational waveform diagram used for describing the operation of the sense amplifier shown in FIG. 10A.

FIG. 10A shows applied potentials to n channel MOS transistors 224c and 224d before the sensing operation, and FIG. 10B shows a potential change at n channel sense amplifier portion.

Before time t0, the backgate potential VBN is at VPRN= (Vcc+Vss)/2 $\phi$ higher than the intermediate potential. Potentials /BL is lower by $\Delta V$ than the bit line precharge potential at the intermediate potential. Common source potential CSN (CSN0) is at the intermediate potential.

At time t0, n sense amplifier enable signal SEN (SEN0) goes low to lower the common source potential CSN. When the potential CSN attains the potential BL at the intermediate potential minus the threshold voltage Vth at time T1, MOS transistor 224d turns on to discharge the potential /BL. The backgate potential VBN is higher than the intermediate potential or the common source potential CSN, and the threshold voltage Vth is lower than that when the source potential CSN and the back gate potential VBN is equal to each other. This is because a surface potential required for forming an inversion layer at a channel region is shifted up by the potential φ to reduce the threshold voltage Vth. Time difference between times t1 and t0 can be made smaller, and fast sensing operation can be implemented.

In addition, even if the intermediate potential (Vcc+Vss)/2 is low and close to a value of the threshold voltage Vth (0) representing the backgate potential VBN at ground potential, the threshold voltage is made smaller prior to the sensing operation, so that n channel MOS transistor 224c or 224d in n sense amplifier can be reliably made conductive. Thus, DRAM operating with a very lower power supply voltage and providing a fast sensing operation can be implemented.

After the sensing operation, the backgate potential VBN is at ground potential, and the threshold voltage of n channel MOS transistors 224 and 224d are made larger as compared to that at sensing operation, and subthreshold current flowing through MOS transistor 224c or 224d into ground line 221 can be suppressed to reduce the current dissipation during the data latching by sense amplifier 224.

Figure 11:
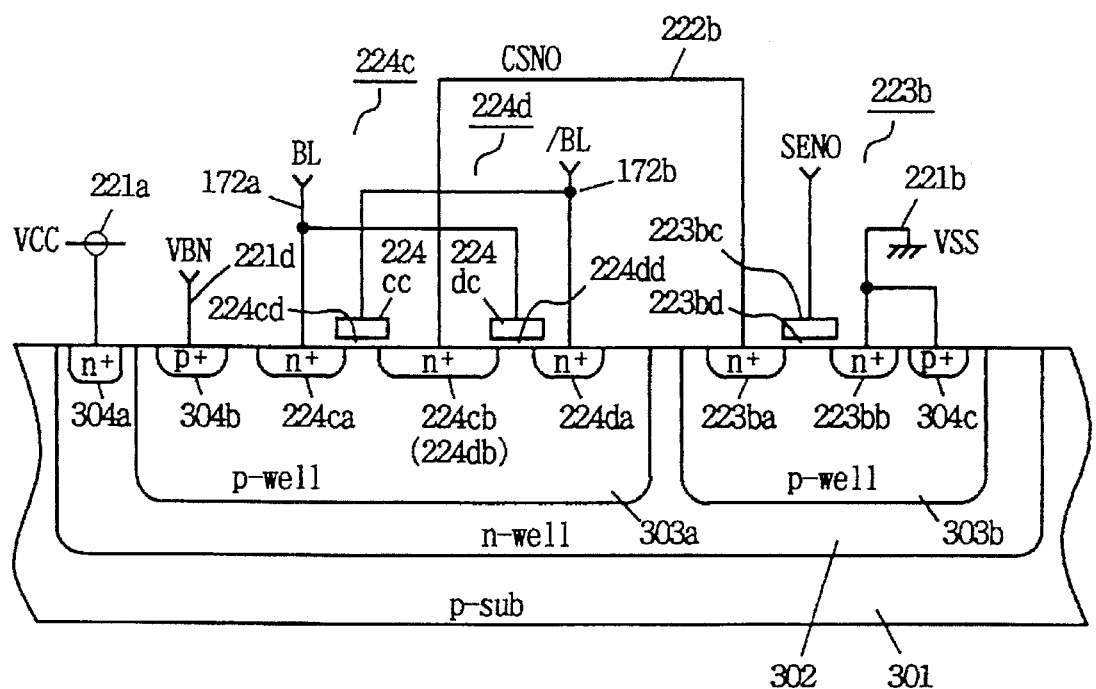
FIG. 11 is a cross sectional view of MOS transistors in NMOS sense amplifier shown in FIG. 8.

FIG. 11 is a simplified cross sectional view of MOS transistors 224c and 224d in sense amplifier 224. Referring to FIG. 11, an n type well region (n well) 302 is formed on a p-type semiconductor substrate (p-sub) 301. On a well 302, p wells 303a and 303b are formed electrically separated from each other and having a higher impurity concentration than that of p-type substrate 301.

On the surface of n well 302 outside p well 303a, a high impurity concentration n type (n+) impurity region 304a is formed to receive power supply potential Vcc at power supply node (line) 221a for application to n well 302.

On the surface of p well 303a, a high impurity concentration p type (p+) impurity region 304b is formed to receive the backgate potential VBN for application to p well 303a.

On the surface of p well 303a, high impurity concentration n type (n+) impurity regions 224ca, 224cb (224db) and 224da are formed being spaced apart from each other. A gate electrode 224cc is formed on a gate insulation film 224cd on a channel region between n+ impurity regions 224ca and 224cb (224db). A gate electrode 224dc is formed on a gate insulating film 224dd on a channel region between n+ impurity regions 224cb (224db) and 224da.

MOS transistor 224c includes gate electrode 224cc, n+ impurity region 224ca as a drain, and n+ impurity region 224cb as a source. MOS transistor 224d includes gate electrode 224dd, n+ impurity region 224db as a source, and n+ impurity region 224da as a drain. N+ impurity region 224ca and gate electrode are connected to bit line 172a, and gate electrode 224ca and n+ impurity region 224da are connected to bit line 172b. N+ impurity region 224cb (224cd) is shared by MOS transistors 224c and 224d, and is connected to common source line 222b.

On the surface of p well 303b, high impurity concentration n type (n+) impurity regions 223ba and 223bb and p+ impurity region 304c are formed being spaced apart from each other. A gate electrode 223bc is formed on a gate insulation film 223bd on a channel region between n+ impurity regions 223ba and 223bb.

P+ impurity region 304c is coupled to receive ground potential for application to p well 303b. MOS transistor 223b includes n+ impurity region 223ba connected common source line 222b as a drain, gate electrode 223bc receiving sense amplifier enable signal SEN0, and n+ impurity region 223bb connected to ground line 221b as a source.

Pn junction diffusion potential φ is a potential between n+ impurity regions 224ca, 224cb and 224da and p well 303a. In other words, pn junction potential φ is a voltage for turning on a p/n+ junction diode.

Figure 12:
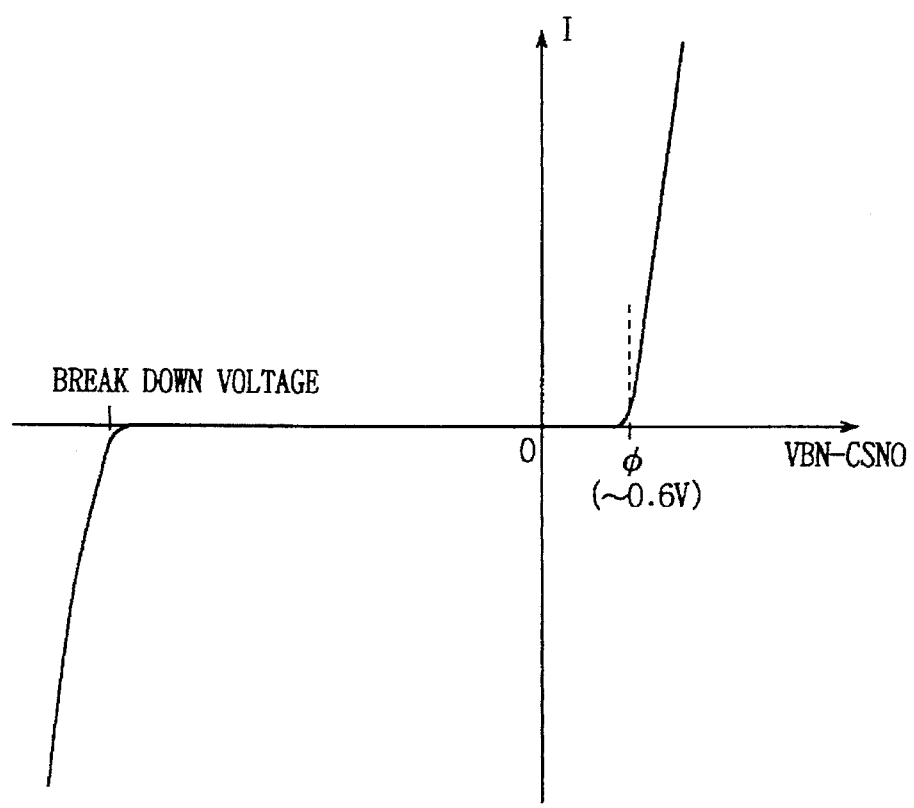
FIG. 12 is a graph showing the pn junction diffusion potential.

FIG. 12 is a graph representing pn junction characteristics, wherein a horizontal axis represents a difference VBN−CSN0 between the backgate potential VBN and the common source node potential CSN0, and a vertical axis represents a current I flowing from p well 303a into n+ region 224cb. As clearly seen from FIG. 12, when the difference VBN−SCN0 exceeds the pn junction diffusion potential φ, a large current I abruptly flows.

Thus, even if the gate potential VBN is raised to the precharge potential VPRN when the common source potential CSN (CSN0 or CSNr) is at the intermediate potential as shown in FIG. 10A, the potential difference VBN−CSN0 is φ and only a very small current I flows from p-well to n+ impurity region 224ca, and no serious problem occurs.

However, there is some risk that the read out voltage ΔV may be reduced. That is, when the bit line potential /BLK is (Vcc+Vss)/2−ΔV, the difference between bit line potential /BL and the backgate potential VBN (=VPRN) is φ+ΔV. Thus, there is a possibility that current I flows from p well 303a into n+ impurity region 224da to raise the bit line potential /BL to reduce the read out voltage ΔV.

Figure 13:
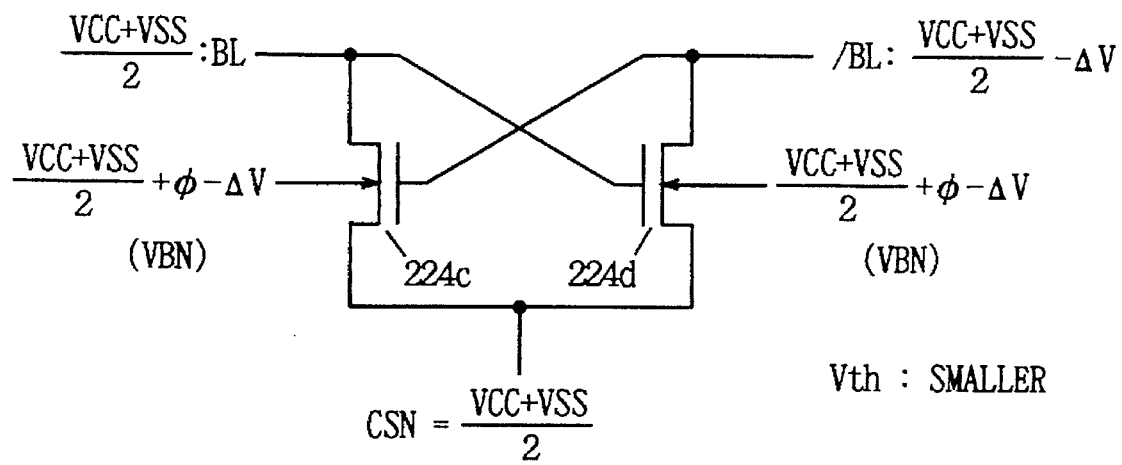
FIG. 13 shows applied potentials at respective nodes of NMOS sense amplifier prior to sensing operation according to a modification of the first embodiment.

In order to avoid such risk, the backgate precharge potential VPRN is preferably set to (Vcc+Vss)/2 φ−ΔV as shown in FIG. 13.

Figure 14:
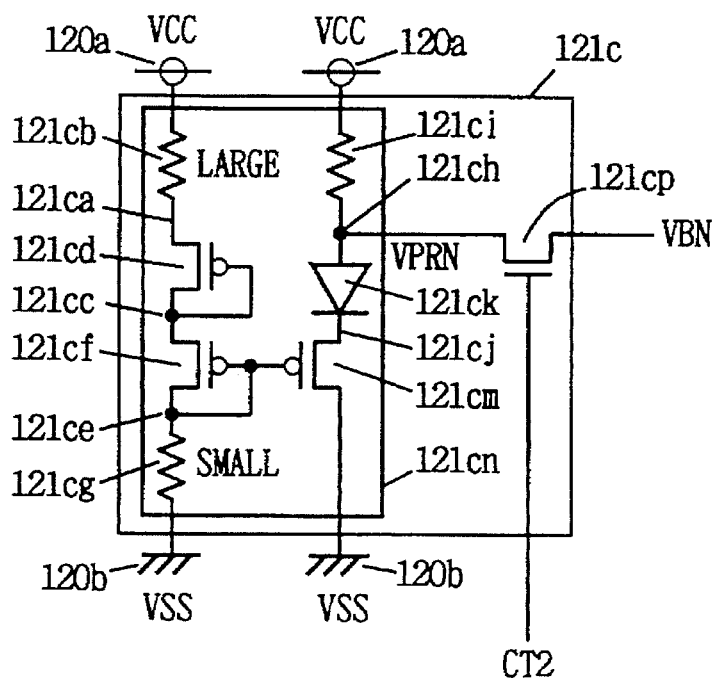
FIG. 14 shows a specific arrangement for generating the backgate precharge potential shown in FIG. 13.

To implement the reduced backgate precharge potential, the resistance value of the resistance element 121cg is made smaller than that of resistance element 121cb in the potential generator 121cn as shown in FIG. 14. A potential at node 121cc is set at the intermediate potential minus the read out voltage, or (Vcc+Vss)/2−ΔV. Alternatively, the absolute value of the threshold voltage of MOS transistor 121cf may be made larger than that of MOS transistor 121cm.

EMBODIMENT 2

Figure 15:
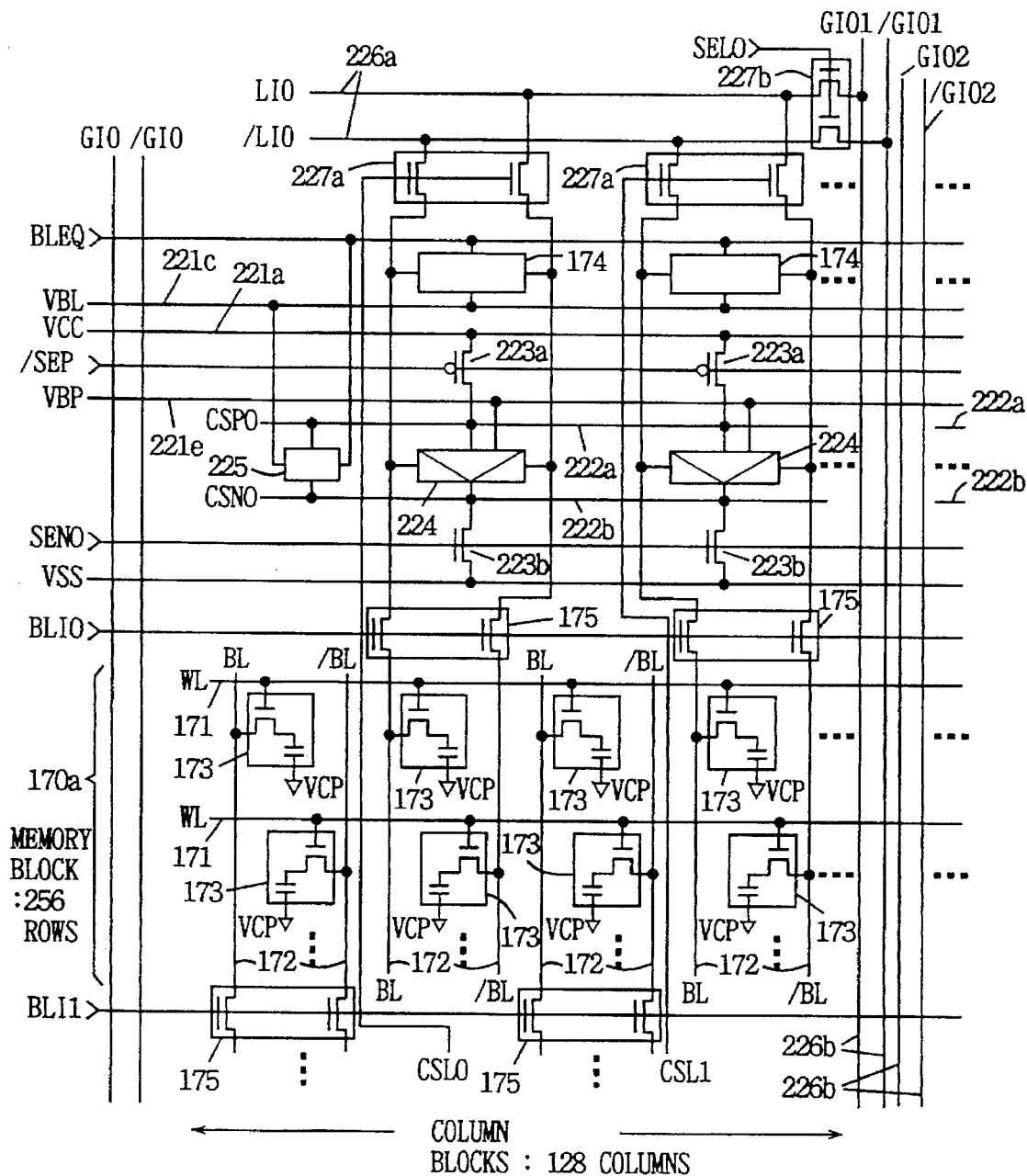
FIG. 15 shows a specific arrangement of a subarray and related peripheral circuitry according to a second embodiment of the present invention.

FIG. 15 shows an arrangement of a subarray and related circuitry according to a second embodiment of the present invention. The arrangement of FIG. 15 is the same as that of FIG. 6 except for the point described below, and corresponding portions are denoted by the same reference numerals, and detailed description thereof is omitted.

In the arrangement of FIG. 15, a p channel backgate potential line 221e is provided extending over a memory mat of 2048 pairs of bit lines, to supply a p channel backgate potential VBP to p channel MOS transistors in sense amplifiers 224. N channel backgate potential line is not provided. P channel backgate potential changes between power supply potential Vcc and a p channel precharge potential VPRN.

Figure 16:
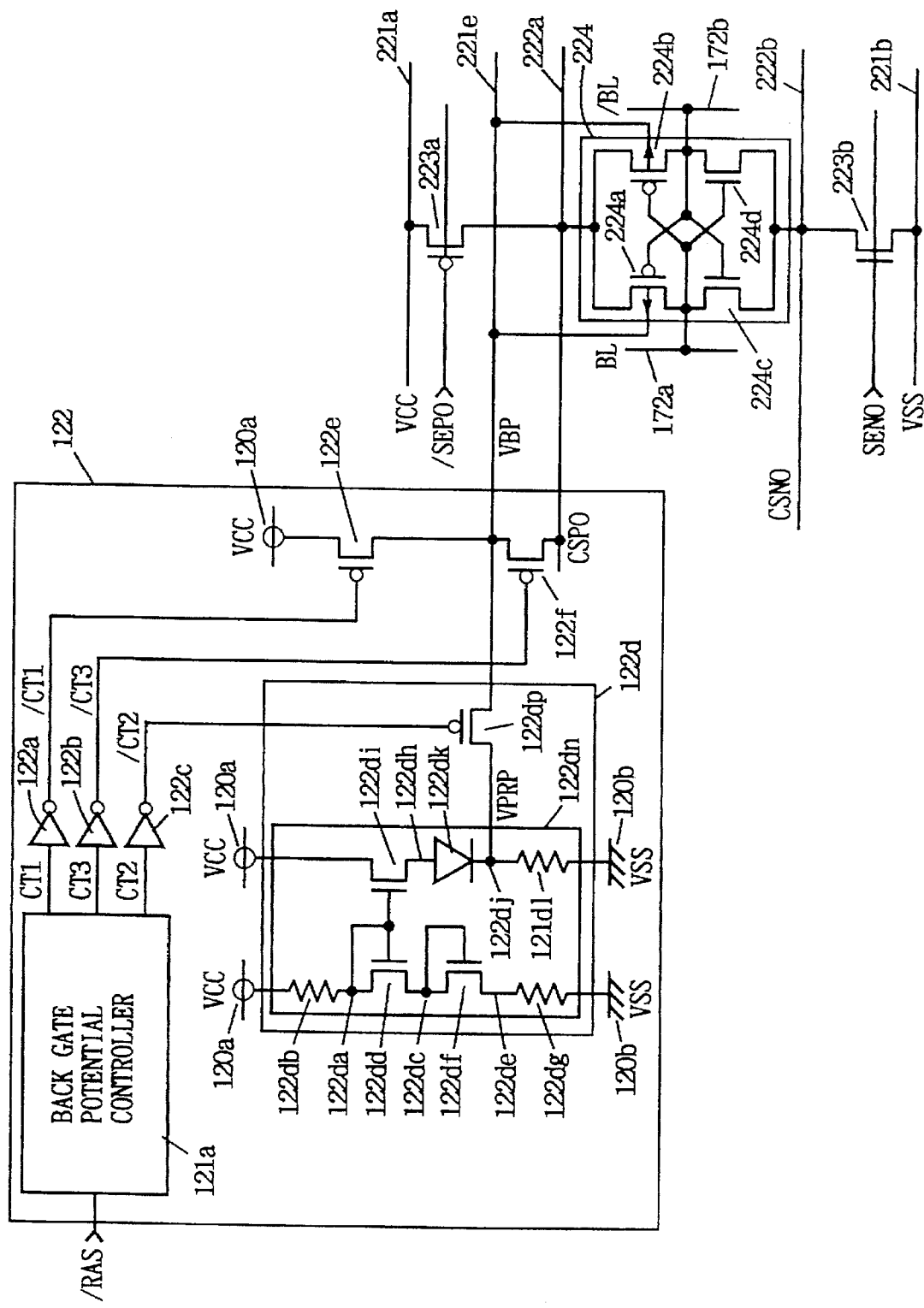
FIG. 16 shows a specific construction of a sense amplifier and related peripheral circuit according to the second embodiment of the present invention.

FIG. 16 shows an arrangement of sense amplifier 224 of FIG. 15 and peripheral circuitry thereof. In FIG. 16, sense amplifier 224 includes cross-coupled p channel MOS transistors 224a and 224b receiving the variable backgate potential VBP (VBPm: m=0~511) and cross-coupled n channel MOS transistors 224c and 224d.

P channel backgate potential generator 122 for generating the backgate potential VBP includes the backgate potential controller 121a having the same configuration of the controller 121a shown in FIG. 8, inverters 122a, 122b and 122c receiving and inverting the control signals CT1, CT2 and CT3 to generate control signals /CT1, /CT2 and /CT3 respectively, a p channel precharge potential supplying circuit 122d operating with power supply potential Vcc and ground potential Vss as power source potentials and producing the p channel backgate precharge potential VPRN at a level between the intermediate potential and the intermediate potential minus pn junction diffusion potential φ, a p channel MOS transistor 122e connected between power supply node 120a and p channel backgate line 221e and having a gate receiving the control signal /CT1, and a p channel MOS transistor 122f coupled between the backgate line 221e and the p channel common source line 222a and having a gate receiving the control signal /CT3.

P channel precharge potential supply circuit 122d includes a p channel precharge potential generator 122dn for producing the precharge potential VPRN from power source potential Vcc and ground potential Vss, and an p channel MOS transistor responsive to the control signal /CT2 for transmitting the precharge potential VPRP to the backgate line 221e.

P channel precharge potential generator 122dn includes a resistance element 122db connected between the power supply node 120a and a node 122da, an n channel MOS transistor 122dd connected between node 122da and a node 122dc and having a gate connected to node 122da, an n channel MOS transistor 122df connected between node 122dc and a node 122de and having a gate connected to node 122dc, and a resistance element 122dg. The resistance value of resistance element 122db is made smaller than that of resistance element 122dg for the reason descried later although these resistance values may be made equal to each other. The resistance values of resistance elements 122db and 122dg are made sufficiently larger than on-resistance (channel resistance) of MOS transistors 122dd and 122df, so that MOS transistors 122dd and 122df operate in a diode mode. MOS transistors 122dd and 122df have the same size or the gate width to gate length ratio.

The potential generator 122dn further includes an n channel MOS transistor 122di connected between power supply node 120a and a node 122db and having a gate connected to node 122da, a diode 122dk formed of pn junction diode for example and connected between node 122dh and a precharge potential output node 122dj, and a resistance element 122dl connected between node 122dj and ground node 120b.

Resistance element 122dl has a current limiting function, and MOS transistor 122di operates in a source follower mode. A potential at node 122dc is at (Vcc+Vss)/2+ΔV because the resistance value of resistance element 122db is smaller than that of resistance element 122dg. Potential at node 122da is (Vcc+Vss)/2+ΔV+Vth. MOS transistor 122di operates in a source follower mode, and potential at node 122db is (Vcc+Vss)/2+ΔV. Thus, the precharge potential VPRP is (Vcc+Vss)/2+ΔV−φ, where A is a forward voltage drop of diode 122dk, or pn junction diffusion potential of MOS transistors 224a and 224b.

Figure 17:
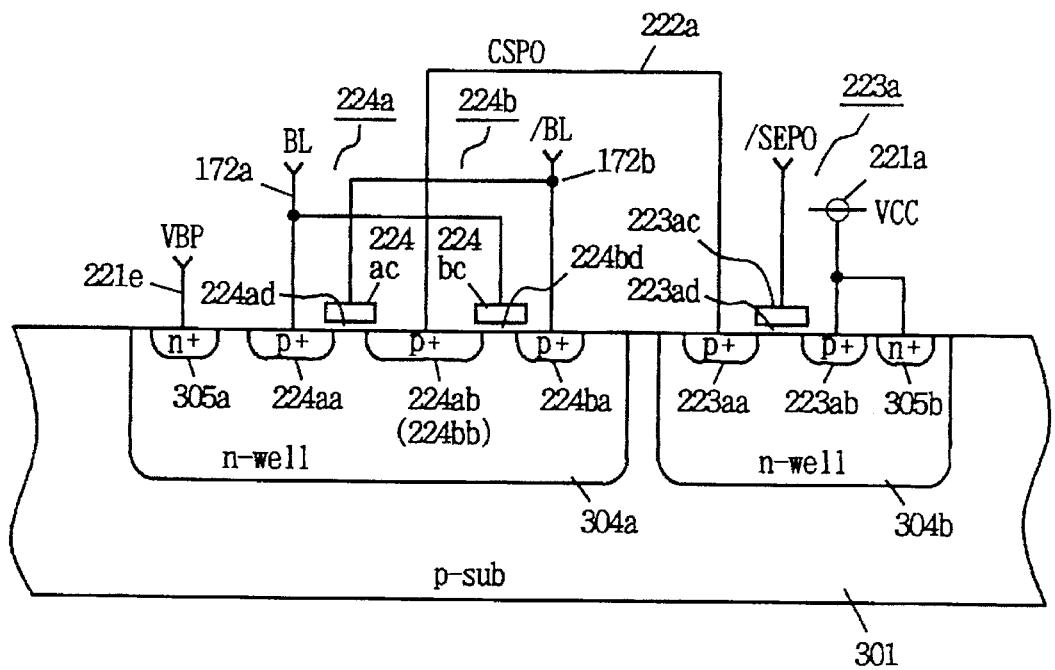
FIG. 17 is a cross sectional view of MOS transistors of PMOS sense amplifier shown in FIG. 16.

FIG. 17 is a schematic cross section view of p sense amplifier portion shown in FIG. 16. Referring to FIG. 17, MOS transistor 224a and 224b are formed on the surface of an n type well region (n well) 304a formed on the surface of p type semiconductor substrate (p-sub) 301. MOS transistor 224a includes a high impurity concentration p type (p+) impurity region 224aa formed on the surface of n well 304a, p+ impurity region 224ab formed being spaced apart from p+ impurity region 224aa, and a gate electrode 224ac formed on a gate insulation film formed on a channel region between p+ impurity regions 224aa and 224ab.

MOS transistor 224b includes p+ impurity region 224ab (224bb), a p+ impurity region 224ba formed spaced apart from p+ impurity region 224ab (224bd) on the surface of p well 304a, and a gate electrode 224bc formed on a gate insulation film 224bd on a channel region between p+ regions 224b a and 224ab (224bb). Here, the reference numerals 224ab and 224bb denote the same p+ impurity region shared by MOS transistors 224a and 224b.

P+ impurity region 224aa and gate electrode 224bc are coupled together to bit line 172, and gate electrode 224ac and p+ impurity region 224ba are coupled together to bit line 172b. N well 304a receives the backgate potential VBP through a high impurity concentration n type (n+) impurity region 305 formed on the surface of n well 304 and coupled to the backgate line 221e. P+ impurity region 224ab (224bb) is coupled to the common source line 222a.

Pn junction diffusion potential φ is a potential difference between P+ impurity region 224aa, 22ab or 224ba and n well 304a. For example, if the common source potential CSP0 exceeds the backgate potential VBP over the diffusion potential φ, the junction between the impurity region 224ab (224bb) and n well 304a is forwardly biased to be conductive, and a current flows from p+ impurity region 224ab (224bb) into n well 304a. Thus, it is kept that VBP≧CSP0+φ.

MOS transistor 223a for activating the p sense amplifier is formed on an n well 304b formed separately from n well 304a on p substrate 301. MOS transistor 223a includes a p+ impurity region 223aa formed on n well 304b and coupled to the common source line 222a, a p+ impurity region 223ab formed separately from p+ impurity region 223aa on n well 304b and coupled to power supply node 221a, and a gate electrode 223ac formed on a gate insulation film 223ad on a channel region between p+ impurity regions 223aa and 223ab and coupled to receive p sense amplifier enable signal /SEP0.

N well 304b receives power supply potential Vcc through an n+ impurity region 305b formed on the surface of n well 304b. Now, operation of the circuitry shown in FIG. 16 will be described with reference to an operation waveform diagram of FIG. 18. Here, only the sensing operation is described because the row and column selection operation is the same as that in the first embodiment shown in the operational waveform diagram of FIG. 7. In the second embodiment, the operation of changing the backgate potential VBP is performed in place of the operation of changing the backgate potential VBN.

Figure 18:
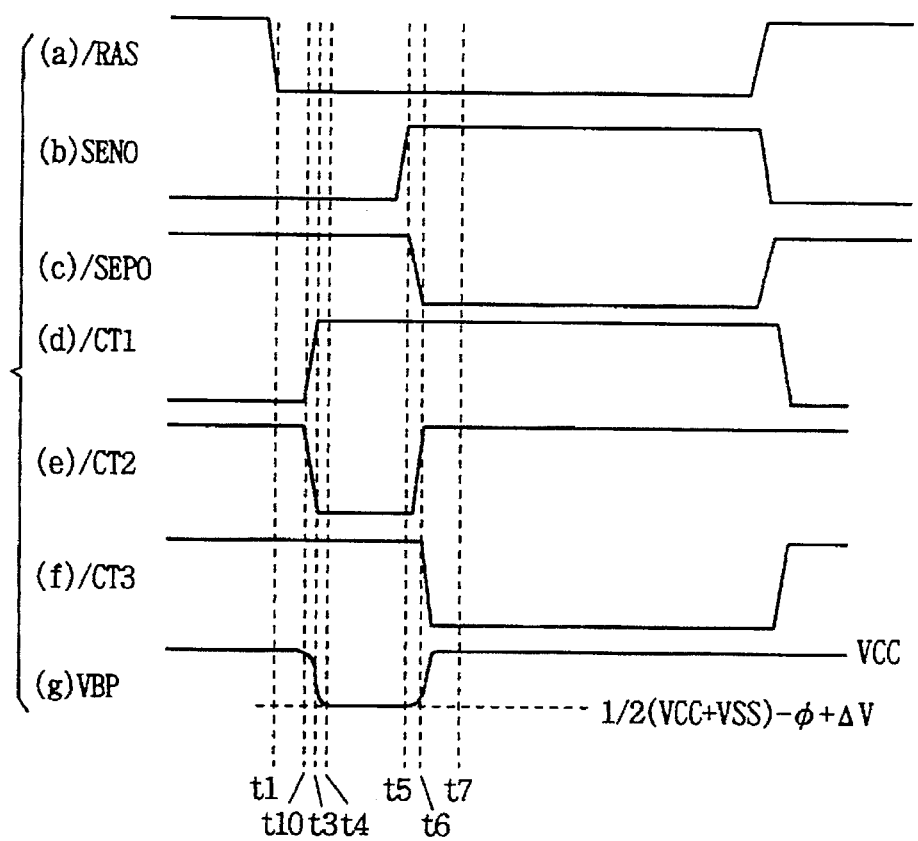
FIG. 18 is an operation waveform diagram representing the operation of the circuitry shown in FIG. 16.

Prior to time t1 at which row address strobe signal /RAS goes low from H level as shown at (a) in FIG. 18, control /CT1 generated from inverter 122a (FIG. 16) is at L level as shown at (d) in FIG. 18, control signal /CT2 from inverter 122c is at H level as shown at (e) in FIG. 18, and control signal /CT3 from inverter 122b is at H level as shown at (f) in FIG. 18. Thus, p channel MOS transistor 122e is conductive in response to control signal /CT1 at L level, and p channel MOS transistors 122f and 122dp are non-conductive in response to control signals /CT2 and /CT3 at H level. Potential VBP on the common source line 221e is at power supply potential Vcc level by the conducting MOS transistors 122e, as shown at (g) in FIG. 18.

When row address strobe signal /RAS changes from H level to L level at time t1 as shown at (a) in FIG. 18, control signals CT1 and CT2 from backgate potential generator 121a change to L level and to H level, respectively, at time t2 (refer to FIG. 7 or 9), and control signal /CT1 from inverter 122a changes to H level at time t10 and control signal /CT2 from inverter 122c changes to L level at time t10, as shown at (d) and (e) in FIG. 18. Responsively, MOS transistor 122e turns off and MOS transistor 122dp turns on, and the precharge potential VBP from potential generator 122dn is transmitted onto the backgate line 221e, so that the backgate potential VBP is lowered from power supply potential Vcc to the precharge potential VPRP. N well 304a is precharged to the precharge potential VPRN (=(Vcc+Vss)/2−φ+ΔV), the difference between the source potential CSP0 and the precharge potential VPRP is equal to the level of φ−ΔV which is smaller than pn junction diffusion potential φ (where φ~0.6 V and ΔV~0.1 V or less), no current flows from p+ impurity region 224aa, 224ab or 224ba into n well 304a, while the absolute values of threshold voltages MOS transistors 224a and 224b are sufficiently smaller than those in the case where the backgate potential VBP is at power supply potential Vcc.

At time t5, sense amplifier enable signal SEN0 is made active to turn on MOS transistor 223b, and n sense amplifier of MOS transistors 224c and 224d is activated. A lower potential of bit line potentials BL and /BL is discharged to ground potential.

At time t6, control signals /CT2 goes high in response to the fall of control signal CT2 as shown at (e) in FIG. 18, and MOS transistor 122dp is turned off to inhibit the transmission of precharge potential VPRP onto the backgate line 221e. Also, control signal /CT3 goes low at time t6 in response to the rise of control signal CT3 as shown at (f) in FIG. 18, and MOS transistor 122f is turned on to intercouple the backgate line 221e and the common source line 222a.

Substantially at the same timing of the intercoupling, the sense amplifier enable signal /SEP0 is made active to turn on pull up MOS transistor 223a. Responsively, the common source potential CSP0 is raised to power supply potential Vcc and accordingly the backgate potential VBP is raised to power supply potential Vcc following the rising of the common source potential CSP0.

Since the absolute voltage of the threshold voltage of MOS transistors 224a and 224b is made smaller, MOS transistors 224 and 224b are rendered conductive soon after the rising of the common source potential SCP0, or immediately after the activation of the sense amplifier enable signal /SEP0, a higher potential of bit line potentials BL and /BL is raised at an earlier timing, and fast sensing operation is implemented.

It is preferable to make the sense amplifier enable signal /SEP0 active at a timing earlier than the change of control signal /CT3 in order to make the absolute values of the threshold voltages of MOS transistors 224a and 224b as small as possible upon the start of sensing operation. However, the sense amplifier enable signal /SEP0 may be activated after conduction of MOS transistor 122f as far as the backgate potential VBP is lower than the common source potential CSP0. Control signal /CT2 is preferably made high before control signal /CT3 is made low, in order to surely have the potential VBP lower following the common source potential CSP0 at high speed. However, control sinal /CT2 may be made high after activation of sense amplifier enable signal /SEP0.

At time t7, the higher potential of bit line potentials BL and /BL is raised up to power supply potential Vcc, and sensing operation is completed, and the data (potentials) on bit lines 172a and 172b are latched. Then, data reading or data writing is made on a selected memory cell as in the first embodiment (refer to FIG. 7).

Figure 19A:
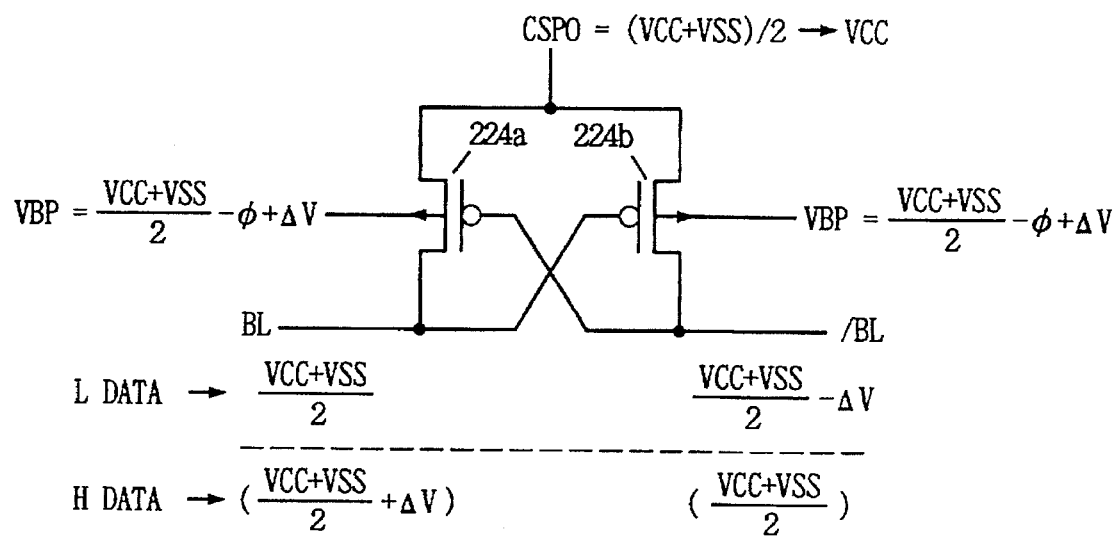
FIG. 19A shows applied potentials at respective nodes of PMOS sense amplifier prior to sensing operation according to the second embodiment.

FIG. 19A shows applied potentials at respective nodes of p sense amplifiers (MOS transistors 224a and 224b) power to the start of sensing operation.

As shown in FIG. 19A, the common source potential CSP0 is at intermediate potential (Vcc+Vss)/2, the backgate potential VBN is at the precharge potential VPRP=(Vcc+Vss)/2−φ+ΔV, and the bit line potential /BL is at (Vcc+Vss)/2−ΔV. The bit line potential BL is at intermediate potential (Vcc+Vss)/2.

The difference between the gate potential and the source and drain potential of MOS transistor 224a is φ−ΔV and does not exceed the pn junction diffusion potential φ, and therefore no current flows into the backgate, or n well 304a (FIG. 17). The potential difference of the backgate and the drain of MOS transistor 224b is φ−2ΔV and does not exceed the pn junction diffusion potential φ, either.

If the higher potential of bit line potentials BL and /BL is (Vcc+Vss)/2+ΔV as shown in the parenthesis in FIG. 19A, the drain to backgate potential difference is φ and does not exceed the pn junction diffusion potential φ. Thus, the reduction of read out voltage ΔV due to current flow from the drain to the backgate (n well) can be reliably prevented.

The backgate potential VBP is lower than power supply potential Vcc, and the source potentials of MOS transistors 224a and 224b are effectively raised and the absolute value |Vthp| of the threshold voltage Vthp of MOS transistors 224a and 224b is made smaller.

Figure 19B:
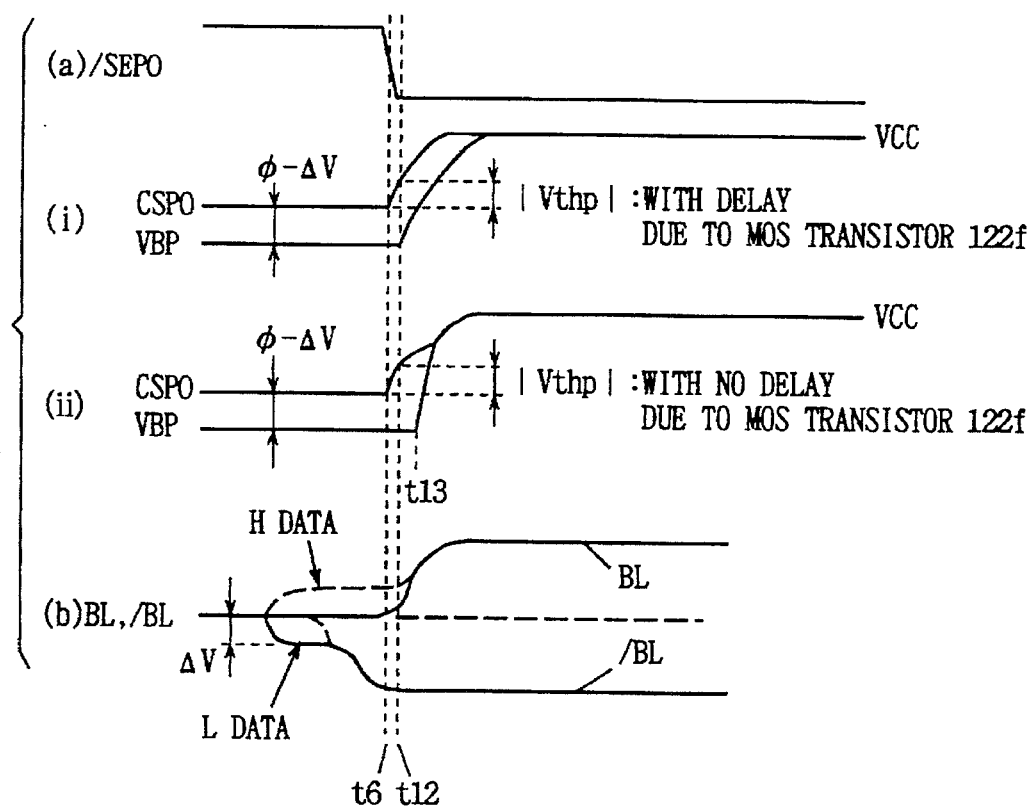
FIG. 19B is an operation waveform diagram representing the operation of PMOS sense amplifier shown in FIG. 19A.

As shown in FIG. 19B, when the sense amplifier enable signal /SEP0 is activated to be low at time t6, the common source potential CSP0 is pulled up to power supply potential Vcc. When the source potential CSP0 is raised up by the absolute value |Vthp| of the threshold voltage of MOS transistors 224a and 224b from the intermediate potential (Vcc+Vss)/2 at time t12 for H level data reading as shown in a dotted line in FIG. 19B at (b), MOS transistor 224a turns on. For the L level data reading in which bit line potential /BL is (Vcc+Vss)/2−ΔV, MOS transistor 224a turns on when the source potential CSP0 attains (Vcc+Vss)/2−ΔV+|Vthp|. Even if the bit line potential /BL is lowered to the ground potential Vss before activation of p sense amplifier, the absolute value of threshold voltage Vthp of MOS transistors 224a and 224b is made smaller, and MOS transistor 224a is made more conductive upon the start of p sense amplifier operation and a large current flow is caused to raise the higher bit line potential BL at high speed.

Even if the intermediate potential (Vcc+Vss)/2 is close to the absolute value of the threshold voltage of PMOS sense amplifier transistors 224a and 224b when the backgate potential VBP is at power supply potential Vcc, the absolute value of threshold voltage Vthp of MOS transistors 224a and 224b is made sufficiently small upon sensing operation, and DRAM operating a very low power supply potential can be implemented.

After time t12, sensing operation is performed. In this operation, the potential VBP is pulled up following the change of the source potential CSP0, and the absolute value of the threshold voltage of MOS transistors 224a and 224b can be reliably kept small.

Here, in FIG. 19B at (i), the potential VBP changes with a delay to the change of the potential CSP0 due to the resistance component of MOS transistor 122f (FIG. 16). On the other hand, in FIG. 19B at (ii), the potential VBNP is once made equal to the potential CSP0 and then changed with the potential CSP0. In this case, the resistance component of MOS transistor 122f is negligible, and the control signal /CT3 is made low at time t13 in order to make the absolute value of threshold voltage of MOS transistors 224a and 224b as small as possible.

Upon data latching after sensing operation, the absolute value of threshold voltage Vthp is made relatively large because MOS transistors 224a and 224b each have the source potential CSP0 and the backgate potential VBP equal to each other, and the subthreshold current can be reliably suppressed to implement low power dissipation during data latch operation.

The precharge potential VBP may be set to (Vcc+Vss)/2−φ by making the resistance values of resistance elements 122db and 122dg into the same value.

EMBODIMENT 3

Figure 20:
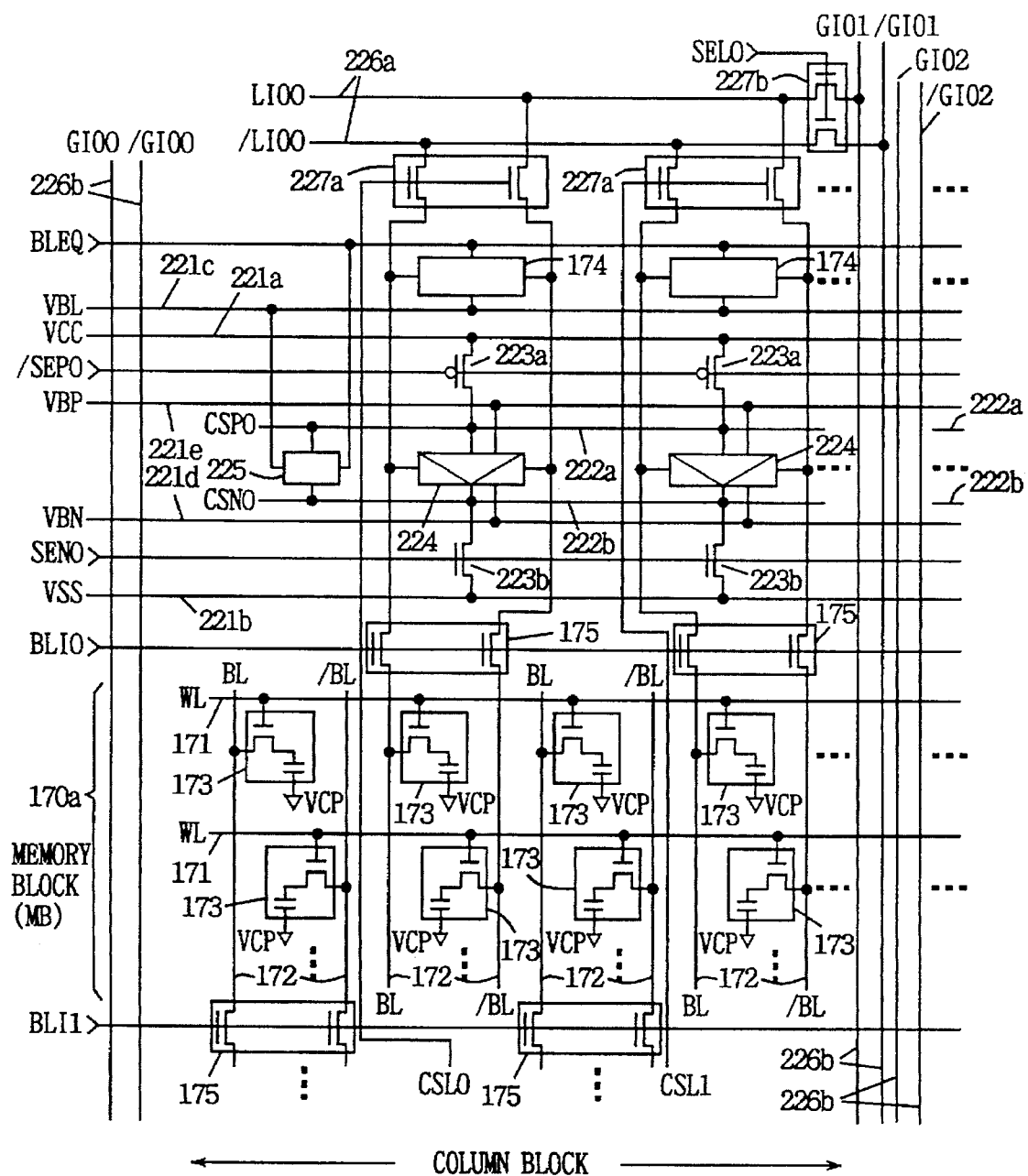
FIG. 20 shows a schematic arrangement of a subarray and related peripheral circuitry according to a third embodiment of the present invention.

FIG. 20 shows an arrangement of a subarray and peripheral circuitry related thereto according to a third embodiment of the present invention. In the arrangement of FIG. 20, n channel backgate line 221d for transmitting the back gate potential VBN to n channel MOS transistors in sense amplifier 224 and p channel back gate line 221e for transmitting the back gate potential VBP to p channel MOS transistors 224 are provided over a memory mat of 2048 pairs of bit lines 172 (16 column blocks). Other configurations are the same as those of the first and second embodiments, and corresponding components are denoted by the same reference numerals.

Figure 21:
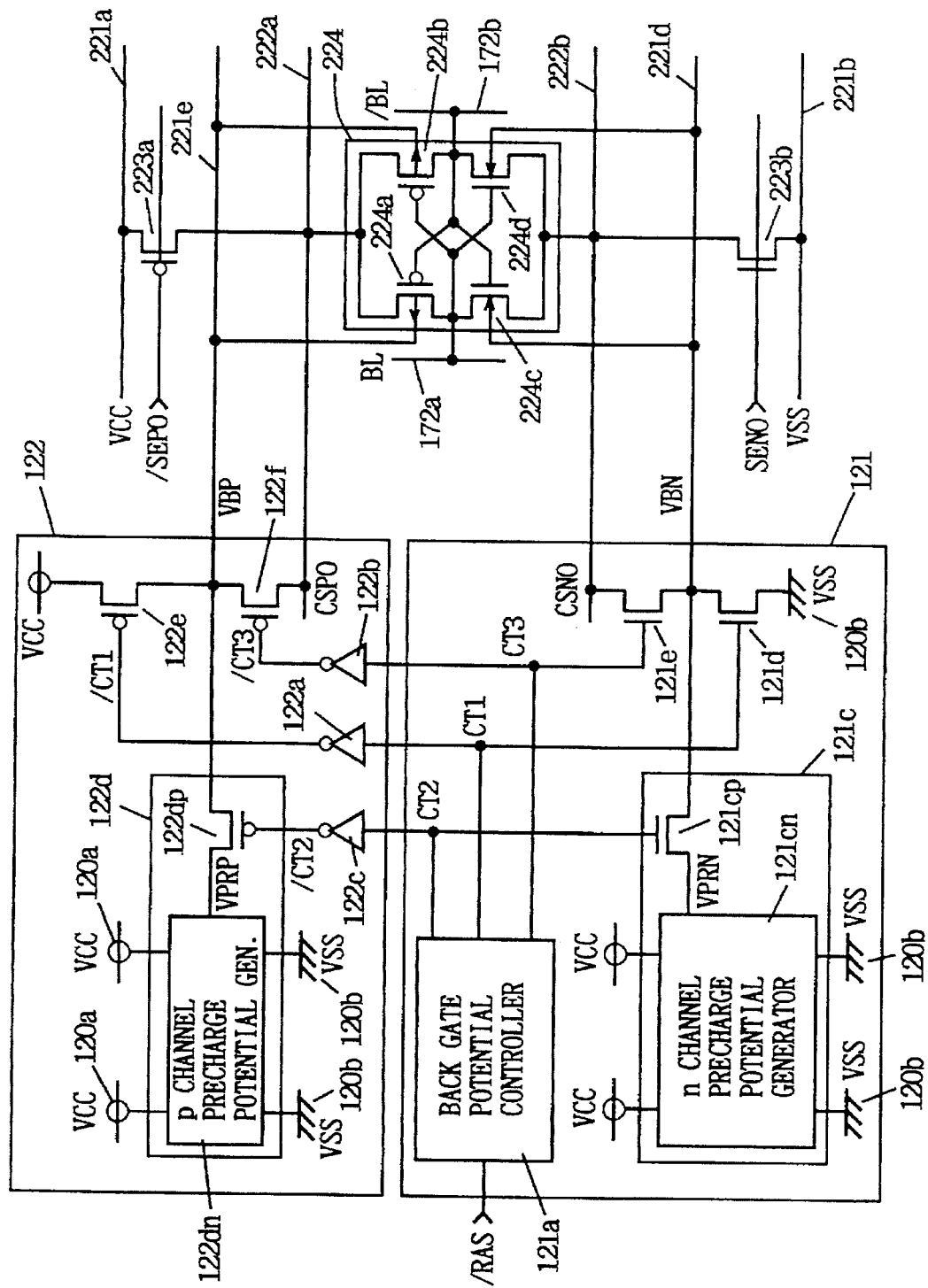
FIG. 21 shows a schematic arrangement of a sense amplifier and its related peripheral circuitry according to the third embodiment.

FIG. 21 shows a configuration of sense amplifier 224 and peripheral circuitry generating n and p back gate potentials VBN and VBP.

Referring to FIG. 21, n channel back gate potential generator 121 has the same configuration as that shown in FIG. 8, and corresponding components have the same reference numerals. According to control signals CT1, CT2 and CT3 generated in response to row address strobe signal /RAS, n channel back gate potential VBN changes between the precharge potential VPRN (=(Vcc+Vss)/2+φ−ΔV) and ground potential Vss.

P channel back gate potential generator 122 have substantially the same configuration as that shown FIG. 16, and corresponding components have the same reference numerals. Back gate potential controller 121a is also employed by the back gate potential generator 122. No back gate potential controller dedicated for p channel back gate potential generator is provided. Reduction in circuit area and power dissipation can be implemented.

N channel sense amplifier portion and p channel sense amplifier portion have the same circuit configuration and the same cross sectional structure as in the first and second embodiments, respectively.

N channel back gate potential VBN changes from ground potential Vss to the precharge potential VPRP at the intermediate potential (Vcc+Vss)/2 plus pn junction diffusion potential φ in response to the fall of row address strobe signal /RAS, and changes to ground potential Vss following the n channel common source potential CSN (CSN0, CSNr).

P channel back gate potential VBP changes from power supply potential Vcc to p channel back gate precharge potential VPRP at the intermediate potential (Vcc+Vss)/2 minus pn junction diffusion potential φ (~0.6 V) in response to the fall of row address strobe signal /RAS, and changes following P channel common source potential CSP (CSP0, CSPr) to power supply potential Vcc.

The arrangement of the third embodiment is substantially the same as the combination of the first and second embodiments, and similar operation is performed and similar meritorious effect can be implemented.

Here, the precharge potential VPRN and VPRP may be set to (Vcc+Vss)/2+φ−ΔV and (Vcc+Vss)/2−φ+ΔV, respectively.

EMBODIMENT 4

Figure 22:
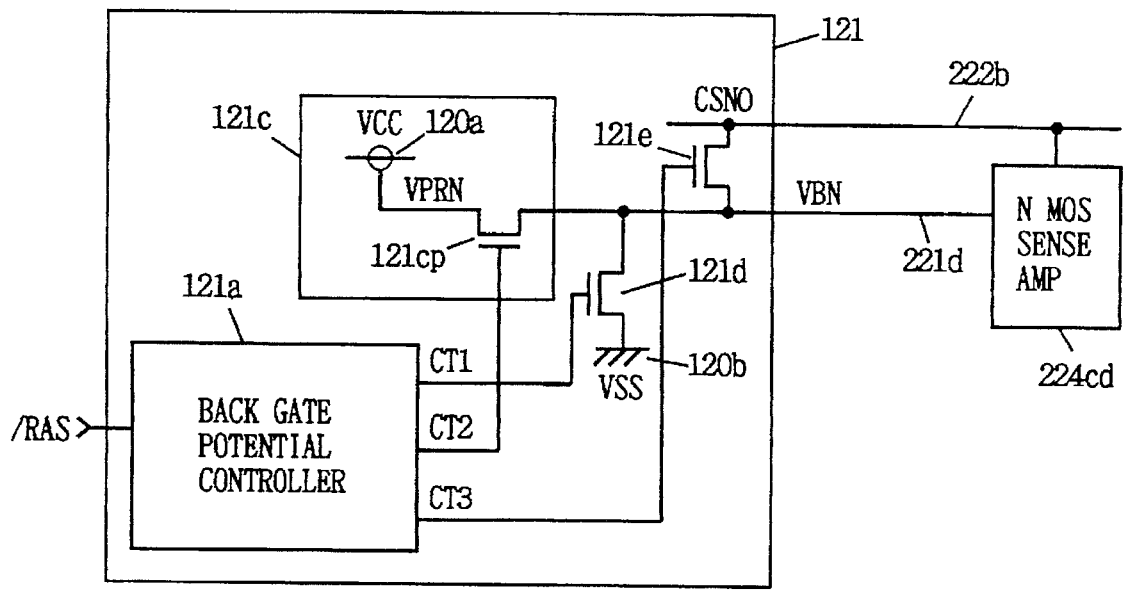
FIG. 22 shows a schematic arrangement of an n channel backgate potential generator for the sense amplifier according to a fourth embodiment.

FIG. 22 shows a schematic arrangement of an n channel back gate potential generator according to a fourth embodiment of the present invention. In the arrangement of FIG. 22, the n channel precharge potential supply circuit 121c includes a power supply node 120a supplying power supply potential Vcc in place of n channel precharge potential generator 121cn. The other construction is the same as that in the first and third embodiments, and the same reference numerals are allotted to like components. The back gate potential VBN is applied to NMOS sense amplifier 224cd (MOS transistors 224c and 224d).

As the integration is advanced, power supply potential Vcc is reduced to 3.3 V, 1.5 V or 1.2 V or less in view of high speed operation and reduced power dissipation. If the power supply potential is 1.0 V, the difference Vcc−Vss is less than two times pn junction diffusion potential φ, or 2φ. Thus, the following in equations (1) and (2) can be obtained.

$$(Vcc+Vss)/2<Vcc, \quad (1)$$

$$Vcc \leq 2\phi + Vss,$$

$$Vcc+Vcc \leq 2\phi + Vcc + Vss$$

$$Vcc \leq (Vcc+Vss)/2+\phi \quad (2)$$

Thus, the power supply potential Vcc itself can be used as the precharge potential VPRN. In this condition, if H level of control signal CT2 is at power supply potential Vcc, not at a boosted potential higher than power supply potential Vcc, the precharge potential VPRN can be made lower than (Vcc+Vss)/2+φ due to the threshold voltage loss at MOS transistor 121cp, and thus the precharge potential VPRN can be set at (Vcc+Vss)/2+φ−ΔV higher than the intermediate potential.

Control signals CT1–CT3 are changed in the similar fashion as in the first and third embodiments, resulting in same operations and same meritorious effects as those in the first and third embodiments.

In addition, n channel precharge potential generator 121cn is not needed, and circuit area can be reduced.

Meanwhile, n channel MOS transistor 121cp may be replaced by a p channel MOS transistor receiving an inverted control signal /CT2 at a gate thereof.

EMBODIMENT 5

Figure 23:
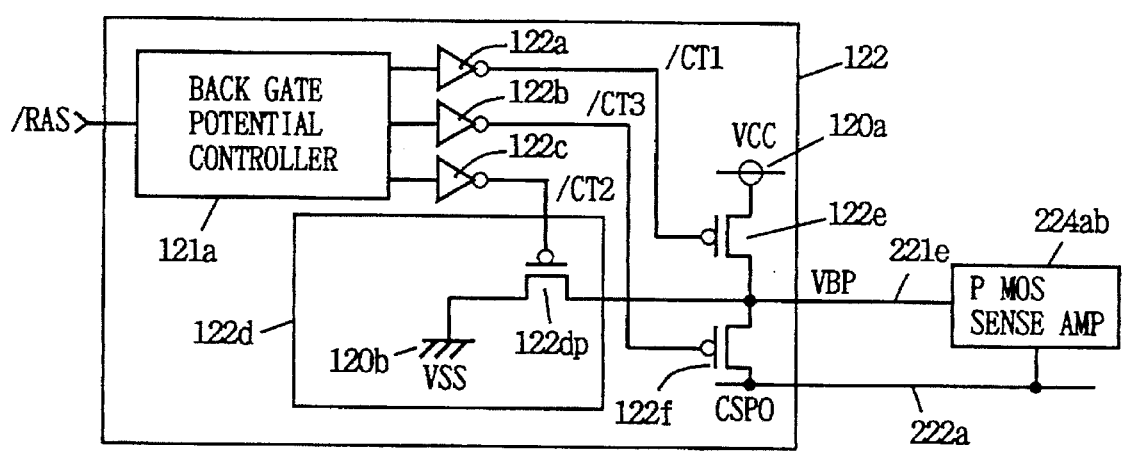
FIG. 23 shows a schematic arrangement of a p channel backgate potential generator for the sense amplifier according to a fifth embodiment of the present invention.

FIG. 23 shows a schematic configuration of p channel precharge potential generator 122 generating the precharge potential VBP applied to back gates of p channel MOS transistors 224a and 224b in p MOS sense amplifier 224ab in sense amplifier 224. In FIG. 23, p channel precharge potential supply circuit 122d includes a ground node 120b in place of p channel precharge potential generator 122dn. The other arrangements are the same as in the second and third embodiments, and like reference numerals are allotted to like components. In this arrangement, the difference between the power supply potential Vcc and ground potential Vss, Vcc−Vss, is no more than twice pn junction diffusion potential φ, or Vcc−Vss ≤ 2φ.

Thus, the following in equations can be obtained:

$$Vcc-2\phi \leq Vss$$

$$Vcc+Vss-2\phi \leq Vss+Vss$$

$$(Vcc+Vss)/2-\phi \leq Vss<Vcc$$

That is, ground potential Vss itself satisfies the condition for the p channel back gate precharge potential VPRP. P channel MOS transistor 122dp transmits the ground potential as the back gate potential VPRP onto the p channel back gate line 221e in response to control signal /CT2. If the threshold voltage of p channel MOS transistor 122dp is taken into account, the precharge potential VBP can be set to (Vcc+Vss)/2−φ+ΔV due to the threshold voltage loss at p channel MOS transistors 122dp.

The condition of Vcc−Vss≦φ can be obtained not only by the reduction of power supply potential, but also by the use of a hierarchical power line arrangement in which power supply potential is shifted down and ground potential is shifted up, and shifted potentials are used as operating power source potentials.

Control signals /CT1−/CT3 are changed in the same fashion as in the second and third embodiments, and the same operation and similar meritorious effect can be implemented.

In addition, the p channel precharge potential generator 122dn is not needed, and circuit area and power dissipation can be reduced.

An n channel MOS transistor receiving the control signal CT2 may be employed in place of p channel MOS transistor 122dp.

EMBODIMENT 6

Figure 24:
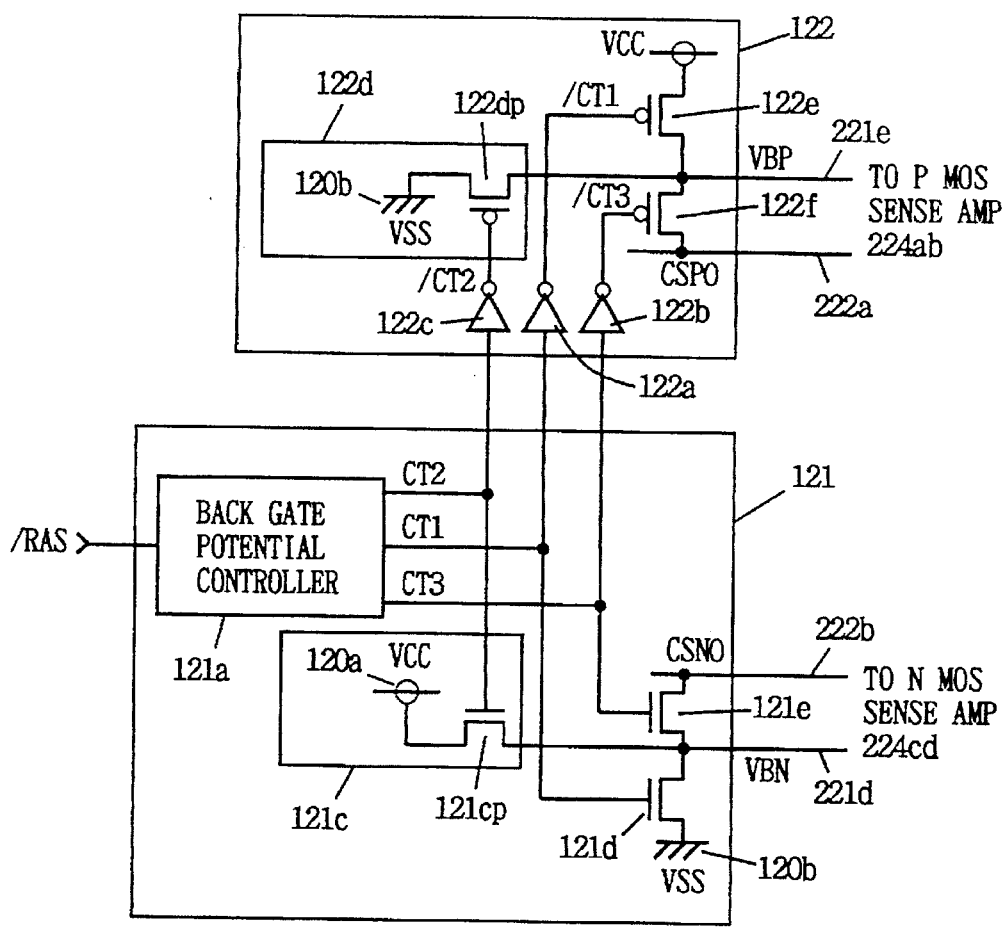
FIG. 24 shows a schematic arrangement of a backgate potential generator for the sense amplifier according to a sixth embodiment of the present invention.

FIG. 24 shows a schematic arrangement of n and p precharge potential generators 120 and 121 according to a sixth embodiment of the present invention. In the sixth embodiment, the difference between power supply potential Vcc and ground potential Vss is no more than twice the pn junction diffusion potential φ between p well and n+ impurity regions in NMOS sense amplifier portions (n channel MOS transistors 224c and 224d) and than twice the pn junction diffusion potential φ2 between n well and p+ impurity regions in P MOS sense amplifier portions (p channel MOS transistors 224a and 224b).

Thus, power supply potential Vcc itself can be the n channel precharge potential VPRN, and ground potential Vss itself can be the p channel precharge potential VPRP.

In FIG. 24, the p channel back gate potential generator 121c includes power supply node 120a supplying the power supply potential Vcc and an n channel MOS transistor 121cp responsive to control signal CT1 from back gate potential controller 121a for selectively transmitting the power supply potential Vcc onto the back gate line 221d to NMOS sense amplifier 224ab.

The n channel precharge potential generator 122d includes a ground node 120b supplying ground potential Vss, and a p channel MOS transistor 122dp responsive to the control signal /CT2 from inverter 122c receiving control signal CT2 from back gate potential controller 121a for selectively transmitting the ground potential Vss onto the back gate line 221e.

The arrangement of FIG. 24 is substantially the same as that of the combination of the fourth and fifth embodiments, and the same operation and meritorious effects are implemented as in the fourth and fifth embodiments. Like components are denoted by like reference numerals in FIGS. 22–24, and specific description is omitted. Back gate potential controller 121a is shared between n and p back gate potential generators 121 and 122, and circuit area and power dissipation can be reduced.

EMBODIMENT 7

In a seventh embodiment, MOS transistors constituting the sense amplifier are formed on SOI (silicon on insulator) substrate.

Figure 25A:
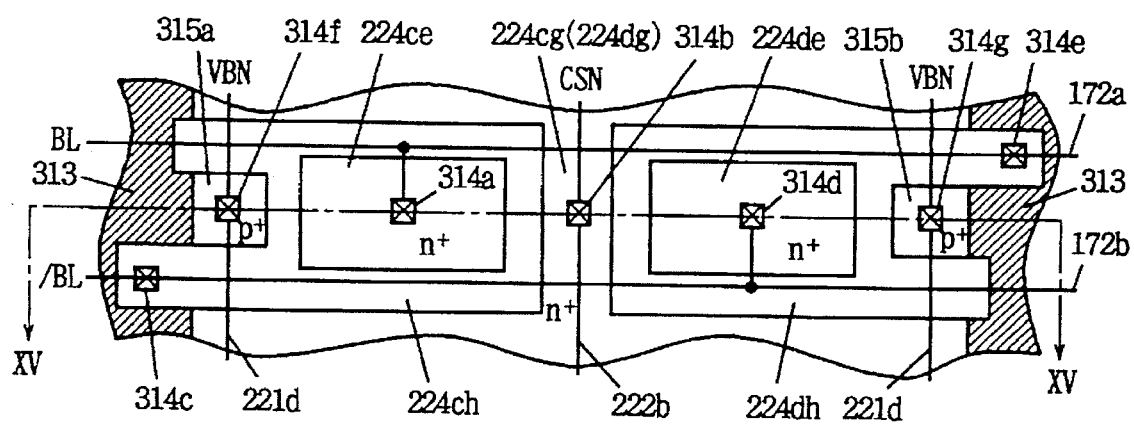
FIG. 25A shows a planar layout of NMOS sense amplifier transistors according to a seventh embodiment of the present invention.
Figure 25B:
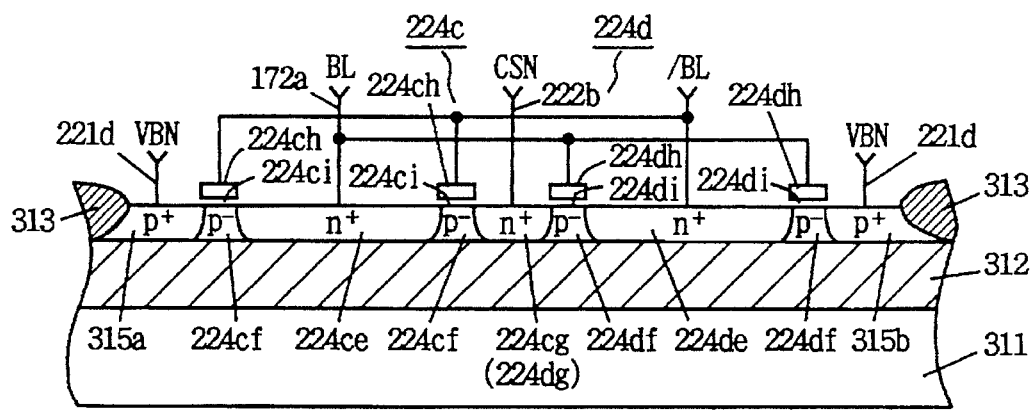
FIG. 25B is a cross sectional view taken along a line XV—XV shown in FIG. 25A.

FIG. 25A shows a schematic planar lay out of n channel sense amplifier transistors 224c and 224d, and FIG. 25B is a cross sectional view taken along the line XV—XV of FIG. 25A.

Referring to FIG. 25A, p+ impurity region 315a, n+ impurity region 224ce, n+ impurity region 224cg (224dg), n+ impurity region 224de and p+ impurity region 315b are formed being spaced apart from each other and aligned along the line XV—XV.

A gate electrode 224ch is formed surrounding the p+ impurity region 315a and n+ impurity region 224ce and opposing to a p− body region. The region between p+ impurity region 315a and n+ impurity region 224ce provides a channel region.

P+ impurity region 315a is coupled to the back gate potential line 221d through a contact hole 314f, gate electrode 224ch is connected to bit line 172b through a contact hole 314c, and n+ impurity region 224ce is coupled to bit line 172a through a contact hole 314a. N+ region 224cg (224dg) outside the gate electrode 224ch is coupled to the p channel common source line 222b through a contact hole 314b.

A gate electrode 224dh is formed being spaced apart from gate electrode 224ch by n+ impurity region 224dg (224cg) and surrounding n+ impurity region 224de and p+ impurity region 315b and opposing to p− body region. Gate electrode 224d is coupled to bit line 172a through a contact hole 314e, n+ impurity region 224de is coupled to bit line 172b through a contact hole 314d, and p+ impurity region 315b is couple to the back gate potential line 221d through a contact hole 314g. Contact holes 314f, 314a, 314d and 314e are aligned on a line, and contact holes 314c ad 314e are substantially placed point-symmetrically with respect to contact hole 314b. Outside the n+ impurity regions 315d and 315c, LOCOS (local oxidation of silicon) film 313 is placed for element isolation.

Referring to FIG. 25B, the respective impurity regions are formed on an insulation layer 312 such as silicon oxide on a p type semiconductor substrate 311. A relatively low impurity concentration p type (p−) impurity region (body region) 224cf is formed between p+ impurity region 315a and n+ impurity region 224ce and surrounding these regions 315a and 224ce. Gate electrode 224ch is formed on a gate insulation film 224ci on p− body region 224cf. A p− impurity (body) region 224cf between n+ impurity regions 224ce and 224cg (224dg) is continuously extended to be linked with body region 224cf between the p+ and n+ impurity regions 315a and 224ce. That is, p− impurity region (body region) 224cf is formed surrounding n+ impurity region 224ce.

Gate electrode 224dj is formed facing to p− body region 224df through an insulation film 224di. P− body region 224df is formed surrounding n+ impurity region 224de and is also located between n+ impurity region 224de and p+ impurity region 315b.

Gate electrode 224dh is also located on the insulation film 224di formed on p− body region 224df between n+ impurity region 224de and p+ impurity region 315b.

N channel sense amplifier transistor 224c includes gate electrode 224ch coupled to receive bit line potential /BL, n+ impurity region 224ce coupled to receive bit line potential BL as a drain, n+ impurity region 224cg(224dg) coupled to receive the common source potential CSN as a source, and p− body region 224cf coupled to receive the well gate potential VBN through p+ impurity region 315a as a back gate.

N channel sense amplifier transistor 224d includes gate electrode 224dh coupled to receive bit line potential BL, n+ impurity region 224dg (224cg) coupled to receive the common source potential CSN as a source, n+ impurity region 224de couple to receive bit line potential /BL as a drain, and p− body region 224df as a back gate. N+ impurity region 224cg (224dg) is shared between the transistors 224c and 224d.

Gate electrode 224ch formed on body region 224cf between p+ impurity region 315a and n+ impurity region 224ce suppresses the expansion of a depletion layer from n+ impurity region 224ce into the bulk region 224cf near p+ impurity region 315a so as to suppress the leak current. Gate electrode 224df adjacent to p+ impurity region 315b likewise suppresses the leak current between n+ impurity region 224de and p+ impurity region 315b.

Pn junction diffusion potential $\phi 1$ (or $\phi$) is provided by a potential at a junction between the body region 224cf and n+ impurity regions 224ce and 224cg, and by a potential at a junction between the p− body region 224df and n+ impurity regions 224dg and 224de.

The bottom surfaces of n+ impurity regions 224ce, 224cg (224dg) and 224de are contacted to the insulation layer 312, and junction areas between n+ impurity regions 224ce and 224cg and p− body region 224cf and between n+ impurity regions 224dg and 224de and p− body region 224df are made smaller, and leakage current flowing through these p−/n+ junctions can be reduced. In addition, the body regions 224cf and 224df are formed on the insulation layer 312, not on the surface of an n well, and therefore no well to well junction capacitance is present, and the body regions 224cf and 224df can be charged and discharged at high speed with less current. Further, transistors 224c and 224d have reduced junction capacitances at source and drain regions, and these transistors 224c and 224d can operate fast, resulting in fast sensing operation by NMOS sense amplifier (transistors 224c and 224d).

Figure 26A:
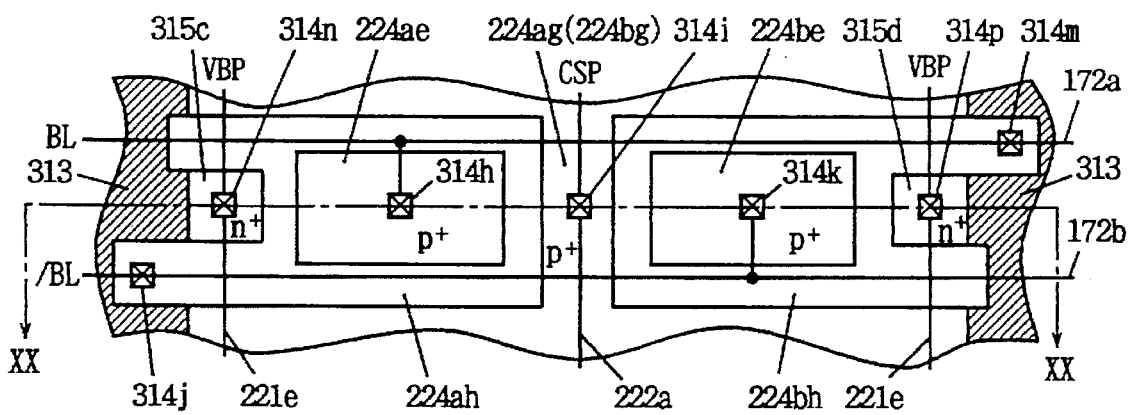
FIG. 26A shows a planar layout of PMOS sense amplifier transistors according to the seventh embodiment of the present invention; and, FIG. 26B is a cross sectional view taken along a line XX—XX shown in FIG. 26A.
Figure 26B:
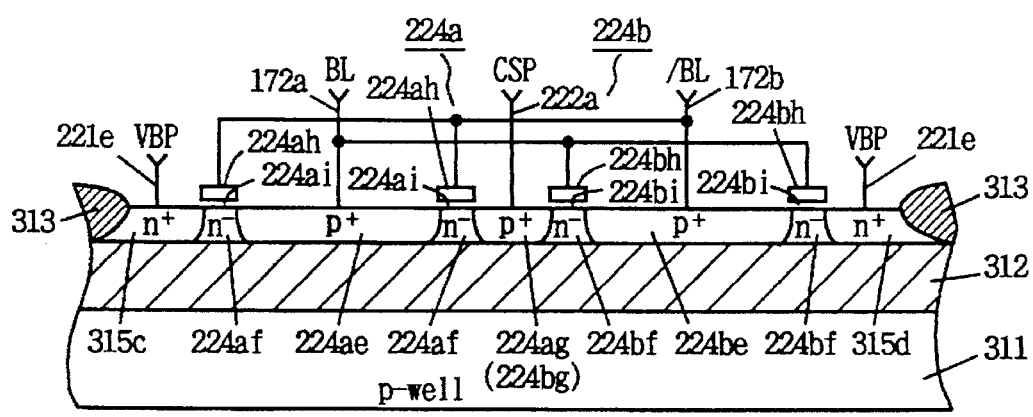

FIG. 26A shows a planar layout of MOS transistors 224a and 224b of P MOS sense amplifier in sense amplifier 224, and FIG. 26B is a schematic cross sectional view taken along the line XX—XX in FIG. 26B. In FIGS. 26A and 26B, like components in the arrangement of FIGS. 25A and 25B have the same reference numerals.

Referring to FIGS. 26A and 26B, p channel sense amplifier transistors 224a and 224b are formed on the insulation layer 312 deposited on p type silicon semiconductor substrate or p well 311.

On the insulation layer 312, there are provided n+ impurity region 315c, p+ impurity region 224ae, p+ impurity region 224ag (224bg), p+ impurity region 224be, and n+ impurity region 315d spaced apart from each other and aligned along the line XX–XX. N− impurity region (body region) 224 is formed surrounding p+ impurity region 224ae and n+ impurity region 315c. A gate electrode 224ah is formed facing to n− body region 224af through a gate insulation film 224ai, and is coupled to bit line 172b through a contact hole 314j. N+ impurity region 315c is coupled to the back gate potential line 221e through a contact hole 314n to apply back gate potential VBP to n− impurity region 224af. P+ impurity region 224ae is coupled to bit line 172a through a contact hole 314h. P+ impurity region 224ag (224bg) is coupled to the common source potential line 222a.

P channel sense amplifier transistor 224a includes a gate electrode 224ah receiving bit line potential /BL, p+ impurity region 224ae receiving bit line potential BL as a drain, p+ impurity region 224ag receiving the common source potential CSP as a source, and n− body region 224af as a back gate.

N− impurity region 224bf is formed surrounding p+ impurity region 224be and n+ impurity region 315d. P+ impurity region 224be is coupled to bit line 172b through a contact hole 314k. N+ impurity region 315d is coupled to the common source potential line 221e through a contact hole 314p to apply the back gate potential VBP to the body region 224bf. Gate electrode 224bh is formed facing to n− body region 224bf through a gate insulation film 224bt and is coupled to bit line 172a through a contact hole 314m.

P channel sense amplifier transistor 224b includes p+ impurity region 224bf (224ag) receiving the common source potential CSP as a source, p+ impurity region 224be receiving bit line potential /BL as a drain, a gate electrode 224bh receiving bit line potential BL, and n− impurity region (body region) 224bf receiving the back gate potential VBP as a back gate.

Contact holes 314n, 314h, 314i, 314k and 314p are aligned with each other, and contact holes 314j and 314m are placed point-symmetrically with respect to contact hole 314i.

Gate electrode 224ah on body region 224 between p+ impurity region 224ae and n+ impurity region 315c and gate electrode 224bh on body region 224bf between p+ impurity region 224be and n+ impurity region 315d are placed for suppressing the expansion of depletion layer from n+ impurity regions 315c and 315d so as to suppress the leakage current between p+ impurity regions 224ae and 224be and n+ impurity regions 315c and 315d, respectively.

Pn junction diffusion potential $\phi$ or $\phi 2$ is provided by a potential at a junction between the body region 224 and p+ impurity (source/drain) regions 224ae and 224ag, and at a junction between the body region 224bf and p+ impurity (source/drain) regions 224be.

N− impurity regions 224ae and 224be are formed spaced apart from each other. P+ impurity region 224ag (224bg) is shared between the transistors 224a and 224b.

In the construction of P MOS sense amplifier portion as shown in FIGS. 26A and 26B, p+ impurity regions 224ae, 224ag (224bg) and 224be each have the bottom surface contact with the insulation layer 312, and the area of junction between p+ impurity regions 224ae and 224ag and the body region 224af and between p+ impurity region 224be and 224bg (224ag) and the body region 224bf are made small, resulting in reduced junction leakage current and therefore reduced power dissipation.

Further, due to reduction in junction area, a junction capacitance between the back gate (body region) and the source and drain region (p+ impurity region) can be reduced, resulting in fast sensing operation by the transistors 224a and 224b.

The body regions 224af and 224bf are formed on the insulation layer, and no well is needed for providing the body regions 224af and 224bf. Thus, a well to well junction capacitance is disappeared at the back gate region, and back gate potential VBP can be changed at high speed with less current consumption.

The sensing operation and memory cell selection operation even upon using the SOI structure for the sense amplifier are the same in the preceding embodiments, and the same meritorious effects as those in the preceding embodiments can be also implemented.

As described hereinbefore, a semiconductor memory device operating with a low power supply potential at a high speed can be implemented.

The back gate potentials VBP and VBN may be changed only for the sense amplifiers provided for the selected subarray. In such an arrangement, power dissipation can be reduced. Such configuration can be implemented by using circuitry for activating the sense amplifier enable signals SEN (SENr) and /SEP (SEPr), or by an arrangement by combining the control signals CT1–CT3 and memory block select signal BS and sense amplifier enable signals SEN and /SEP. Alternatively, all the sense amplifiers may receive the back gate potentials VBP and VBN changed simultaneously.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A sense amplifier circuit for differentially amplifying potentials on a first bit line and a second bit line paired with said first bit line, said first and second bit lines precharged at an intermediate potential between a first power potential and a second power potential different from said first power potential, said sense amplifier circuit comprising:

a first activation transistor coupled between a first power node receiving said first power potential and a first node precharged to said intermediate potential and responsive to a first sense amplifier enable signal being active for electrically coupling said first power node and said first node;

a first sense transistor connected between said first node and said first bit line and having a gate coupled to said second bit line and having a backgate receiving a first backgate potential precharged to a first precharge potential prior to activation of said first sense amplifier enable signal and changing with a potential at said first node during activation of said first sense amplifier enable signal, a difference in absolute value between said first precharge potential and said first power potential being greater than that between said intermediate potential and said first power potential; and a second sense transistor connected between said first node and said second bit line and having a gate coupled to said first bit line and a backgate receiving said first backgate potential.

2. The sense amplifier circuit according to claim 1, wherein each of said first and second sense transistors comprises a first impurity region of a first conductivity type electrically connected to a corresponding one of the first and second bit lines, a second impurity region of said first conductivity type spaced apart from said first impurity region and electrically connected to said first node, and a bulk region of a second conductivity type different from said first conductivity type and serving as said backgate, and wherein a difference in absolute value between said first precharge potential and said intermediate potential is no greater than a pn junction diffusion potential at a junction between said first and second impurity regions and said bulk region.

3. The sense amplifier circuit according to claim 2, wherein one of said first and second bit lines has a potential changed by a read out voltage due to reading out of memory cell data during precharging of said backgate to said first precharge potential, and wherein said first precharged potential is set to such a potential level that said difference in absolute value is greater than zero and no greater than a value of said pn junction diffusion potential minus said read out voltage.

4. The sense amplifier circuit according to claim 1, wherein said first and second sense transistors each comprise a p channel insulated gate type transistor, and said first power potential is an operational power supply potential for said sense amplifier circuit, and said second power potential is a ground potential for said sense amplifier circuit.

5. The sense amplifier circuit according to claim 1, wherein said first and second sense transistors each comprise an n channel insulated gate type transistor, and said first power potential is a ground potential for said sense amplifier circuit, and said second power potential is an operation power supply potential for said sense amplifier circuit.

6. The sense amplifier circuit according to claim 5, wherein said first precharge potential is the operation power supply potential for said sense amplifier circuit.

7. The sense amplifier circuit according to claim 4, wherein said first precharge potential is the ground potential for said sense amplifier circuit.

8. The sense amplifier circuit according to claim 1, wherein said first and second sense transistors are formed on an SOI substrate having an insulation layer formed on a semiconductor region.

9. The sense amplifier circuit according to claim 1, further comprising:

a second activation transistor coupled between a second power node receiving said second power potential and a second node precharged to said intermediate potential and responsive to a second sense amplifier enable signal being active for electrically coupling said second power node and said second node;

a third sense transistor connected between said second node and said first bit line and having a gate coupled to said second bit line and having a second backgate receiving a second backgate potential precharged to a second precharge potential prior to activation of said second sense amplifier enable signal and changing with a potential at said second node during activation of said second sense amplifier enable signal, a difference in absolute value between said second precharge potential and said second power potential being greater than that between said intermediate potential and said second power potential; and a fourth sense transistor connected between said second node and said second bit line and having a gate coupled to said first bit line and a second backgate receiving said second backgate potential.

10. The sense amplifier circuit according to claim 9, wherein each of said third and fourth sense transistors comprises a third impurity region of a second conductivity type electrically connected to a corresponding one of the first and second bit lines, a fourth impurity region of said second conductivity type spaced apart from said third impurity region and electrically connected to said second node, and a second bulk region of a first conductivity type different from said second conductivity type and serving as said second backgate, and wherein a difference in absolute value between said second precharge potential and said intermediate potential is no greater than a pn junction diffusion potential at a junction between said third and fourth impurity regions and said second bulk region.

11. The sense amplifier circuit according to claim 10, wherein one of said first and second bit liens has a potential changed by a read out voltage due to reading out of memory cell data during precharging of said second backgate to said second precharge potential, and wherein said second precharge potential is set to such a potential level that said difference in absolute value is greater than zero and no greater than a value of said pn junction diffusion potential minus said read out voltage.

12. The sense amplifier circuit according to claim 9, wherein said third and fourth sense transistors each comprise a p channel insulated gate type transistor, and said second power potential is an operational power supply potential for said sense amplifier circuit, and said first power potential is a ground potential for said sense amplifier circuit.

13. The sense amplifier circuit according to claim 9, wherein said third and fourth sense transistors each comprise an n channel insulated gate type transistor and said second power potential is a ground potential for said sense amplifier circuit, and said first power potential is an operation power supply potential for said sense amplifier circuit.

14. The sense amplifier circuit according to claim 13, wherein said second precharge potential is the operation power supply potential for said sense amplifier circuit.

15. The sense amplifier circuit according to claim 12, wherein said second precharge potential is the ground potential for said sense amplifier circuit.

16. The sense amplifier circuit according to claim 9, wherein said third and fourth sense transistors are formed on an SOI substrate having an insulation layer formed on a semiconductor region.

17. A semiconductor memory device comprising:
a first and second bit lines each connecting a predetermined number of memory cells;
a sense amplifier including a first sense transistor coupled between a first node and said first bit line and having a control gate coupled to said second bit line and a first backgate, and a second sense transistor coupled between said first node and said second bit line and having a control gate coupled to said first bit line and a second backgate, said first and second backgates connected to a first backgate node, for differentially amplifying potentials on said first and second bit lines;
a first sense enable transistor coupled between a first power node and said first node and responsive to a first sense amplifier enable signal being active for electrically connecting said first power node and said first node;
precharge circuitry coupled to said first node for precharging said first node at an intermediate potential between a first power potential and a second power potential different from said first power potential in response to a precharge instructing signal being active;
first backgate potential generator operating with said first and second power potentials for generating a first backgate precharge potential at a level between said intermediate potential and said second power potential;
a first means coupled between said first backgate potential generator and said first backgate node for transmitting said first backgate precharge potential onto said first backgate node in response to a first control signal being active;
a second means coupled between said first node and said first backgate node for electrically connecting said first node and said first backgate node in response to a second control signal being active; and
controller coupled to receive a memory cycle start instructing signal and responsive to activation of said memory cycle start instructing signal for activating said first control signal for application to said first means prior to activation of said first sense amplifier enable signal, and for activating said second control signal during activation of said first sense amplifier enable signal, said precharge instructing signal being deactivated in response to activation of said memory cycle start instruct signal, and said first sense amplifier enable signal being activated in response to the activation of said memory cycle start instructing signal.

18. The semiconductor memory device according to claim 17, wherein said controller includes;
a first delay means coupled to receive said memory cycle start instructing signal for delaying said memory cycle start instructing signal by a first predetermined time to generate a third control signal,
a first gate means coupled to receive said third control signal for activating said first control signal for a second predetermined time in response to deactivation of said third control signal, and
a second gate means coupled to receive said first and third control signals for activating said second control signal in response to deactivation of both of said first and third control signals.

19. The semiconductor memory device according to claim 18, further comprising
a third means coupled between said first power node and said first backgate node and responsive to said third control signal being active for electrically connecting said first power node and said first backgate node.

20. The semiconductor memory device according to claim 18, wherein each of said first and second sense transistors comprises a first impurity region of a first conductivity type electrically connected to a corresponding one of the first and second bit lines, a second impurity region of said first conductivity type spaced apart from said first impurity region and electrically connected to said first node, and a bulk region of a second conductivity type different from said first conductivity type and serving as said backgate, and wherein a difference in absolute value between said first backgate precharge potential and said intermediate potential is no greater than a pn junction diffusion potential at a junction between said first and second impurity regions and said bulk region.

21. The semiconductor memory device according to claim 20, wherein one of said first and second bit lines has a potential changed by a read out voltage due to reading out of memory cell data prior to activation of said first control signal and wherein said first backgate precharge potential is set to such a potential level that said difference in absolute value is greater than zero and no greater than a value of said pn junction diffusion potential minus said read out voltage.

22. The semiconductor memory device according to claim 17, wherein said first and second sense transistors each comprise a p channel insulated gate type transistor, and said first power potential is an operational power supply potential, and said second power potential is a ground potential, and said first backgate precharge potential is the ground potential.

23. The semiconductor memory device according to claim 17, wherein said first and second sense transistors each comprise an n channel insulated gate type transistor, and said first power potential is a ground potential, and said second power potential is an operation power supply potential, and said first backgate precharge potential is the operation power supply potential.

24. The semiconductor memory device according to claim 17, wherein said first and second sense transistors are formed on an SOI substrate having an insulation layer formed on a semiconductor region.

25. The semiconductor memory device according to claim 17, wherein said sense amplifier further includes a third sense transistor coupled between a second node and said first bit line and having a control gate coupled to said second bit line and a third backgate, and a fourth sense transistor coupled between said second node and said second bit line and having a control gate coupled to said first bit line and a fourth backgate, said third and fourth backgates connected to a second backgate node, and said precharge circuitry includes means coupled to said second node to precharge said second node to said intermediate potential in response to said precharge instructing signal being active, and wherein said semiconductor memory device further comprises, second backgate potential generator operating with said first and second power potentials for generating a second backgate precharge potential at a level between said intermediate level and said first power potential, a first connecting means coupled between said second backgate potential generator and said second backgate node for transmitting said second backgate precharge potential onto said second backgate node in response to said first control signal being active;

a second connecting means coupled between said second node and said second backgate node for electrically connecting said second node and said second backgate node in response to said second control signal being active, a second sense enable transistor coupled between a second power node receiving said second power potential and responsive to a second sense amplifier enable signal for coupling said second node to said second power node.

26. The semiconductor memory device according to claim 25, further comprising means coupled between said second power node and said second backgate node for electrically connecting said second power node and said second backgate node in response to deactivation of said memory cycle start instruct signal.

27. The semiconductor memory device according to claim 25, wherein each of said third and fourth sense transistors comprise a third impurity region of a second conductivity type electrically connected to a corresponding one of the first and second bit lines, a fourth impurity region of said second conductivity type spaced apart from said third impurity region and electrically connected to said second node, and a second bulk region of a first conductivity type different from said second conductivity type and serving as said third or fourth backgate, and wherein a difference in absolute value between said second precharge potential and said intermediate potential is no greater than a pn junction diffusion potential at a junction between said third and fourth impurity regions and said second bulk region.

28. The semiconductor memory device according to claim 27, wherein one of said first and second bit lines has a potential changed by a read out voltage due to reading out of memory cell data, and wherein said second precharge potential is set to such a potential level that said difference in absolute value is greater than zero and no greater than a value of said pn junction diffusion potential minus said read out voltage.

29. The semiconductor memory device according to claim 25, wherein said third and fourth sense transistors each comprise a p channel insulated gate type transistor, and said second power potential is an operation power supply potential, and said first power potential and said second backgate precharge potential each are a ground potential.

30. The semiconductor memory device according to claim 25, wherein said third and fourth sense transistors each comprise an n channel insulated gate type transistor, and said first power potential and said second backgate precharge potential each are an operation power supply potential, and said second power potential is a ground potential.

31. The semiconductor memory device according to claim 25, wherein said third and fourth sense transistors are formed on an SOI substrate having an insulation layer formed on a semiconductor region.

\* \* \* \* \*